US008488085B2

(12) United States Patent
Nakamura et al.

(10) Patent No.: US 8,488,085 B2
(45) Date of Patent: *Jul. 16, 2013

(54) DISPLAY DEVICE

(75) Inventors: Kozo Nakamura, Osaka (JP); Shun Ueki, Osaka (JP); Akiko Miyazaki, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 571 days.

This patent is subject to a terminal disclaimer.

(21) Appl. No.: 12/531,671

(22) PCT Filed: Mar. 13, 2008

(86) PCT No.: PCT/JP2008/054638

§ 371 (c)(1), (2), (4) Date: Sep. 16, 2009

(87) PCT Pub. No.: WO2008/114695
PCT Pub. Date: Sep. 25, 2008

(65) Prior Publication Data

US 2010/0066956 A1 Mar. 18, 2010

(30) Foreign Application Priority Data

Mar. 16, 2007 (JP) ................................ 2007-068999

(51) Int. Cl.
*G02F 1/1335* (2006.01)
(52) U.S. Cl.
USPC .......................................... 349/108; 349/106
(58) Field of Classification Search
USPC .......................................... 349/106–109, 144
See application file for complete search history.

(56) References Cited

U.S. PATENT DOCUMENTS

| | | | |
|---|---|---|---|
| 4,800,375 | A | 1/1989 | Silverstein et al. |
| 6,097,367 | A | 8/2000 | Kuriwaki et al. |
| 6,144,352 | A | 11/2000 | Matsuda et al. |
| 6,958,791 | B2 | 10/2005 | Shimoshikiryo |
| 7,034,789 | B2 | 4/2006 | Takeuchi et al. |
| 7,268,757 | B2 | 9/2007 | Ben-David et al. |
| 2004/0150777 | A1 | 8/2004 | Koike |
| 2004/0174389 | A1 | 9/2004 | Ben-David et al. |
| 2004/0222999 | A1 | 11/2004 | Choi et al. |

(Continued)

FOREIGN PATENT DOCUMENTS

| | | | |
|---|---|---|---|
| JP | 09-251160 | A | 9/1997 |
| JP | 11-003051 | A | 1/1999 |

(Continued)

OTHER PUBLICATIONS

English translation of the International Preliminary Report issued in corresponding International Patent Application No. PCT/JP2008/054638, mailed on Oct. 1, 2009.

(Continued)

*Primary Examiner* — Bumsuk Won
*Assistant Examiner* — Charles Chang
(74) *Attorney, Agent, or Firm* — Keating & Bennett, LLP

(57) ABSTRACT

A display device which has a wide color gamut and is able to display bright red, includes a plurality of pixels each defined by a plurality of subpixels. The plurality of subpixels include first and second red subpixels for displaying red, a green subpixel for displaying green, a blue subpixel for displaying blue, and a yellow subpixel for displaying yellow. The blue subpixel and the yellow subpixel are contiguous with each other.

19 Claims, 35 Drawing Sheets

U.S. PATENT DOCUMENTS

| | | | |
|---|---|---|---|
| 2005/0122294 A1* | 6/2005 | Ben-David et al. | 345/87 |
| 2005/0134785 A1* | 6/2005 | Roth et al. | 349/144 |
| 2005/0168423 A1* | 8/2005 | Hirata et al. | 345/88 |
| 2007/0052887 A1* | 3/2007 | Brown et al. | 349/108 |
| 2007/0063946 A1 | 3/2007 | Nakamura et al. | |
| 2009/0141381 A1 | 6/2009 | Itou et al. | |

FOREIGN PATENT DOCUMENTS

| | | | |
|---|---|---|---|
| JP | 2001-209047 A | 8/2001 | |
| JP | 2001-306023 A | 11/2001 | |
| JP | 2004-157378 A | 6/2004 | |
| JP | 2004-258488 A | 9/2004 | |
| JP | 2004-334199 A | 11/2004 | |
| WO | 2006/109577 A1 | 10/2006 | |

OTHER PUBLICATIONS

Official Communication issued in International Patent Application No. PCT/JP2008/054638, mailed on Apr. 15, 2008.

Pointer: "The Gamut of Real Surface Colours"; Color Research and Application; vol. 5; No. 3; 1980, pp. 145-155.

Yang et al.: "31.1: Development of Six Primary-Color LCD", SID 05 Digest; May 25-27, 2005, pp. 1210-1213.

Chino et al.: "25.1: Invited Paper: Development of Wide-Color-Gamut Mobile Displays With Four-Primary-Color LCDs"; SID 06 Digest; Jun. 7-9, 2006, pp. 1221-1224.

Ben-Chorin: "Improving LCD TV Color Using Multi-Primary Technology"; FPD International 2005 Forum; Oct. 19, 2005, 66 pages.

\* cited by examiner

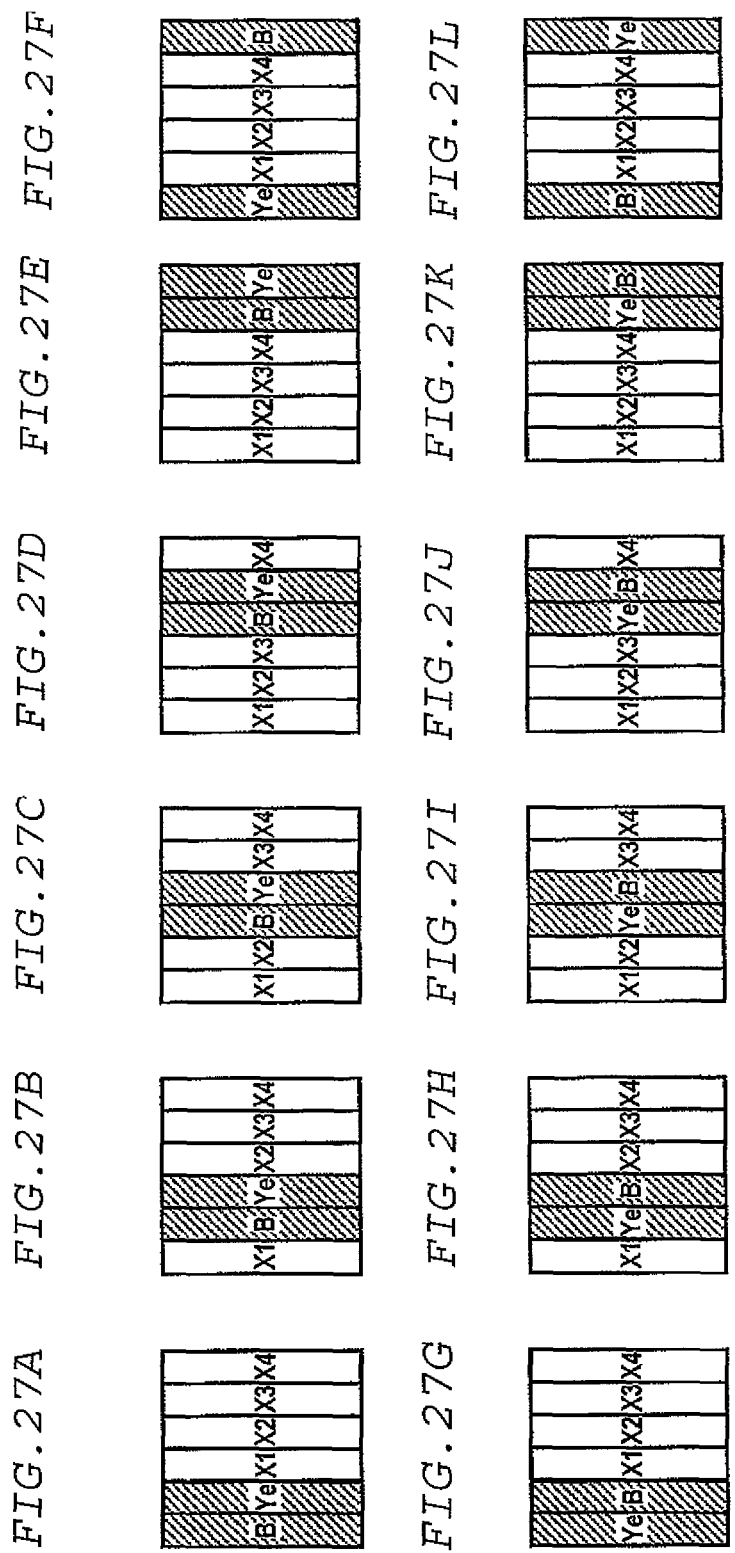

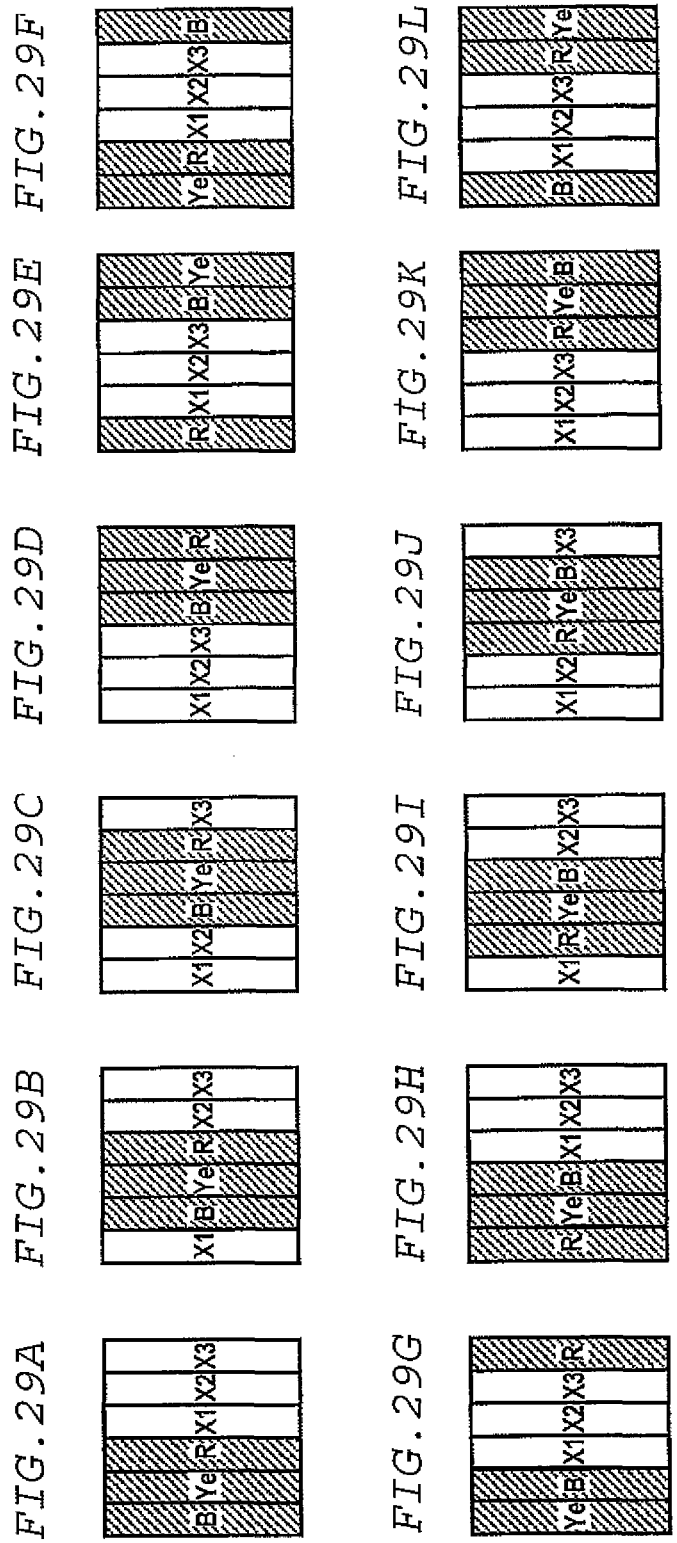

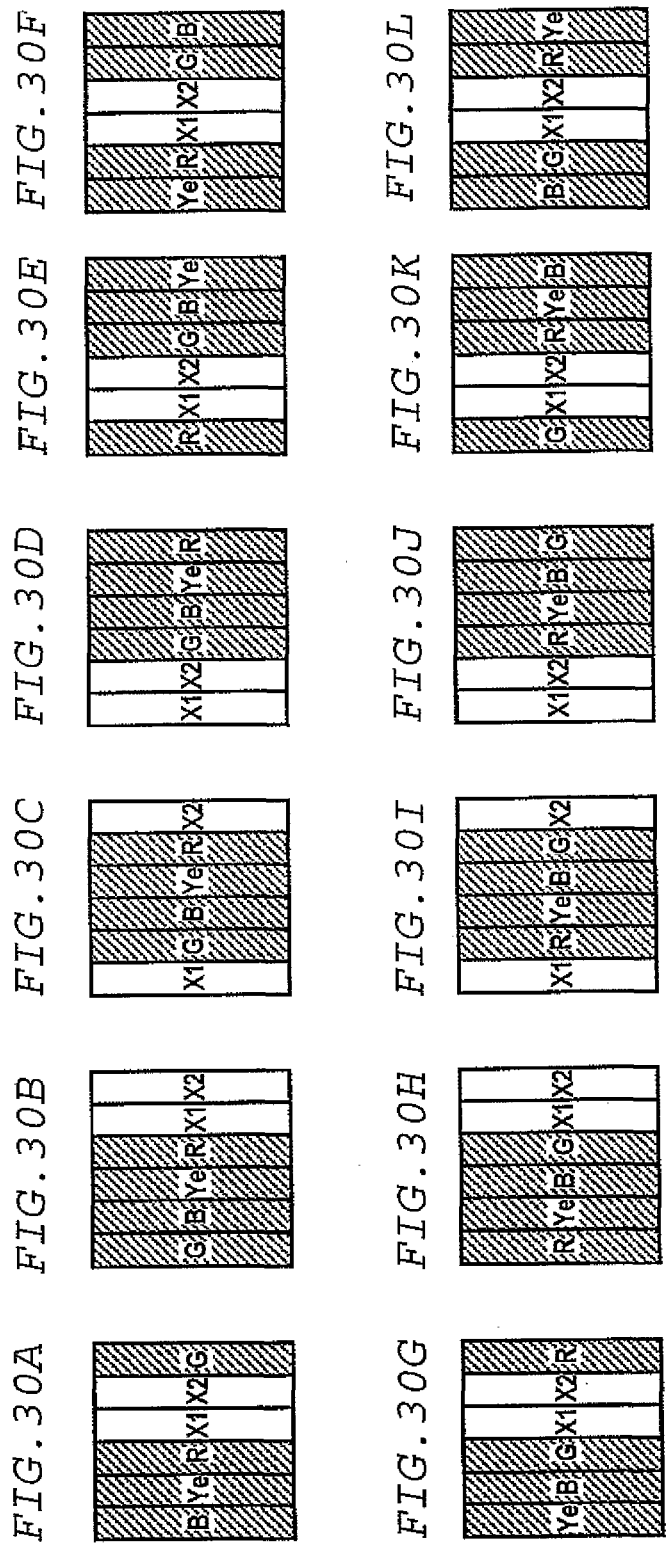

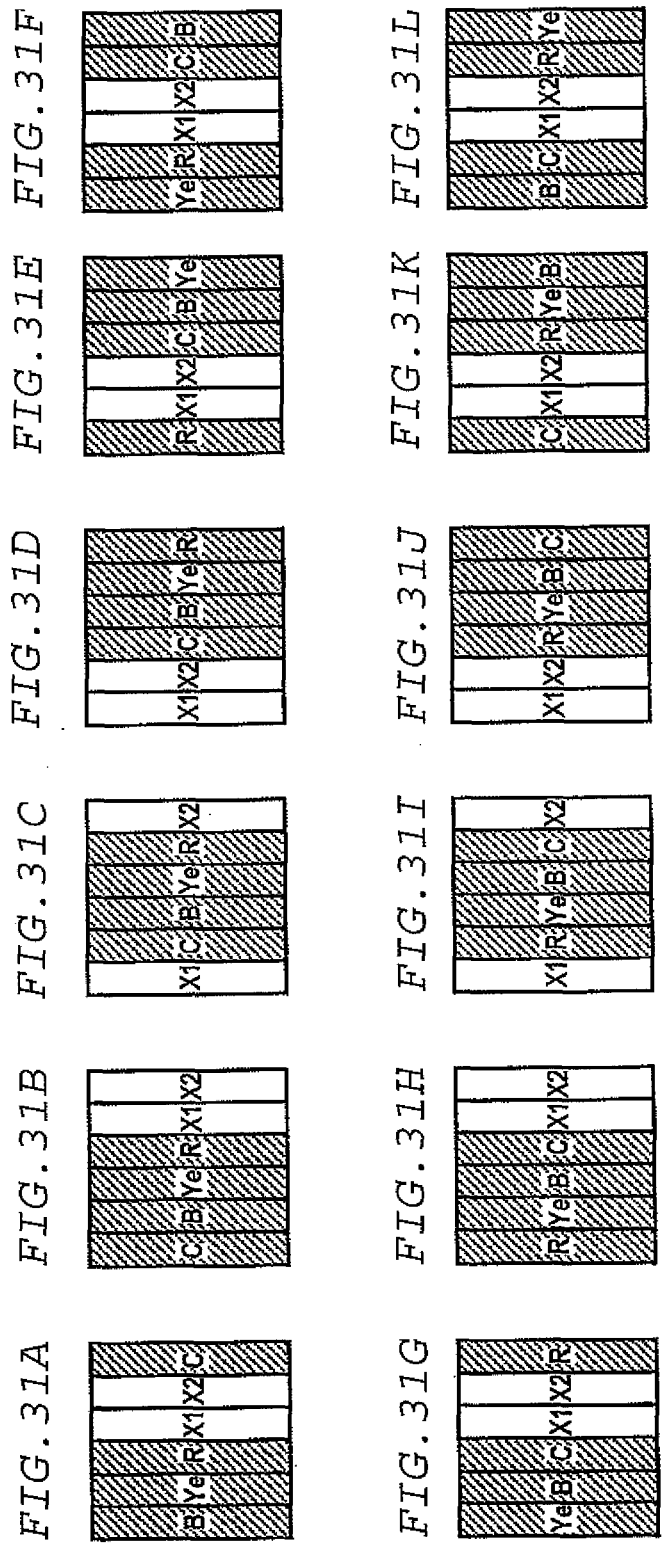

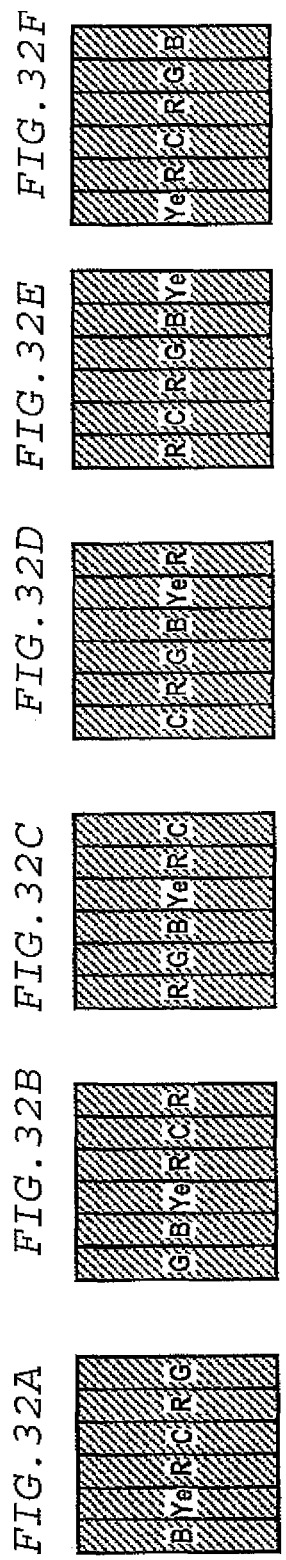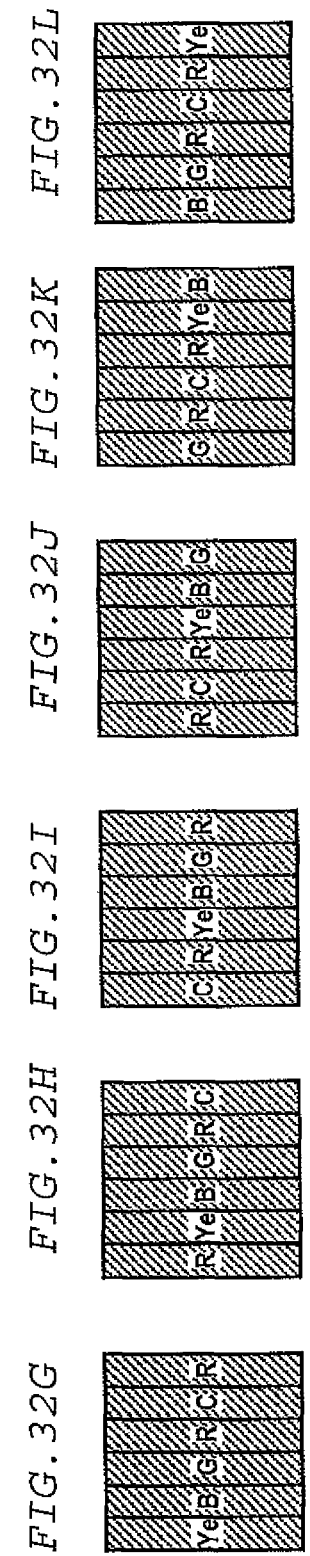

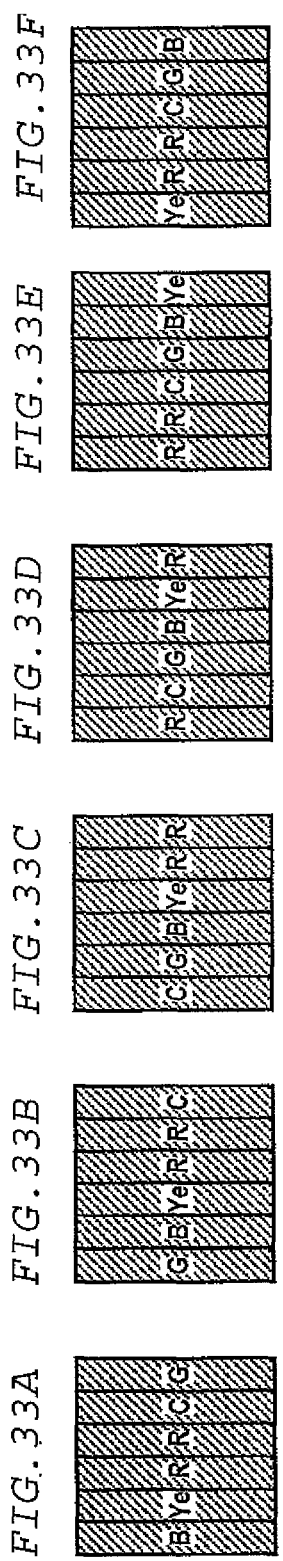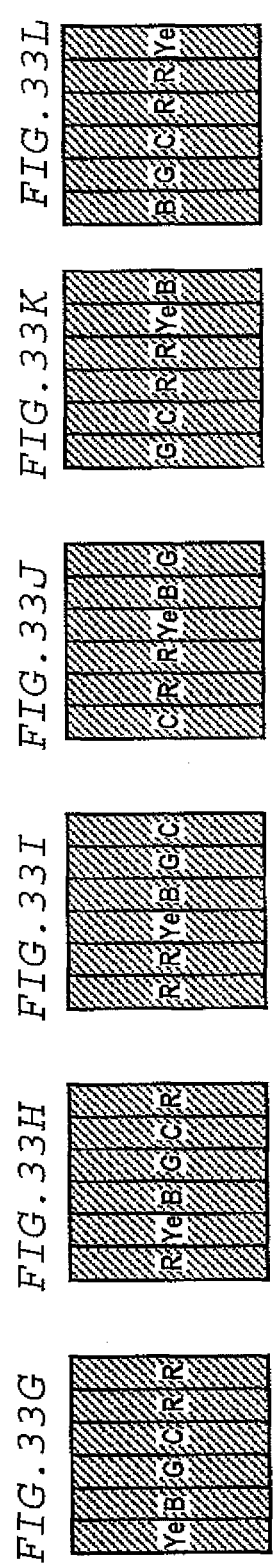

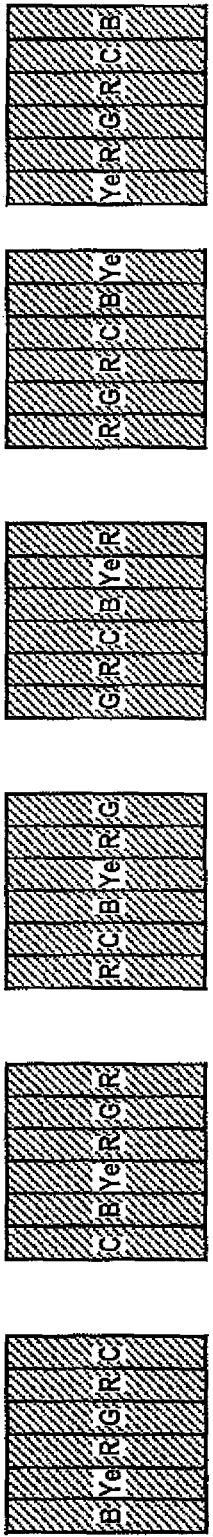

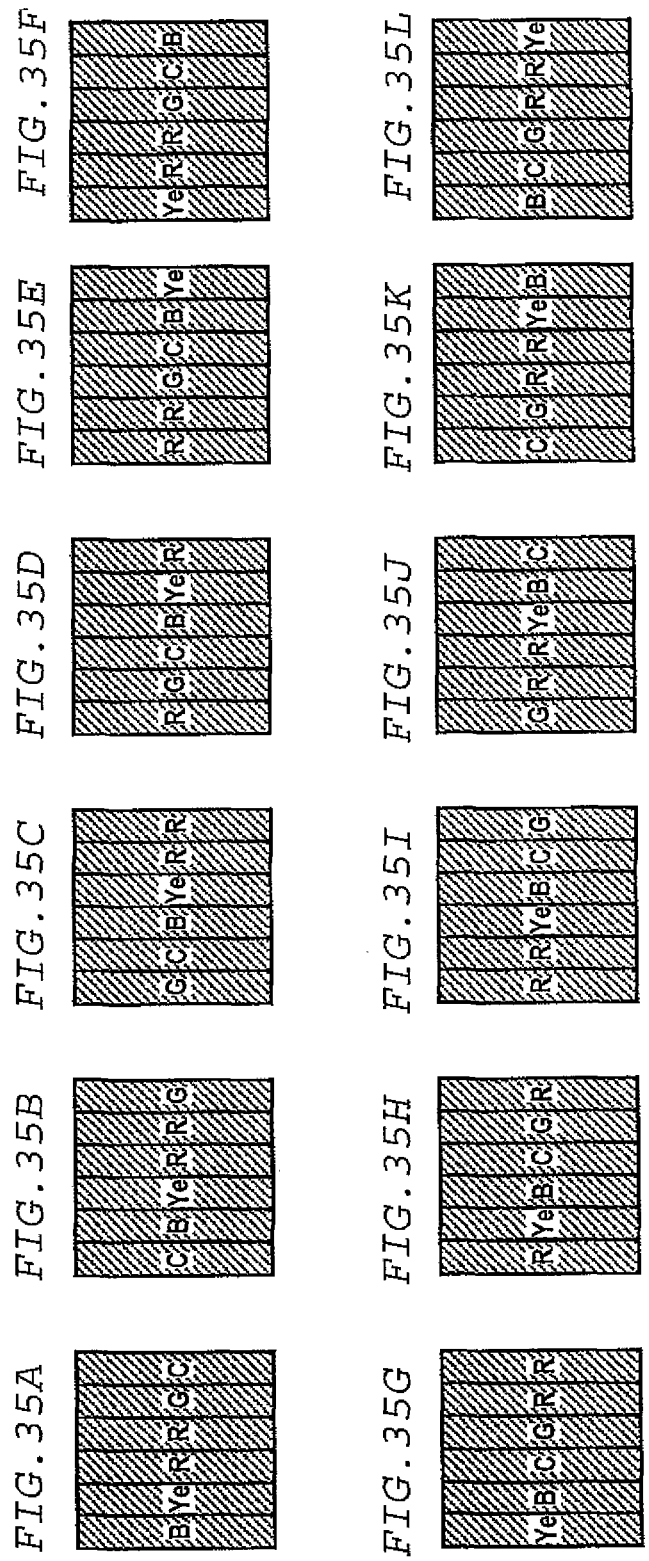

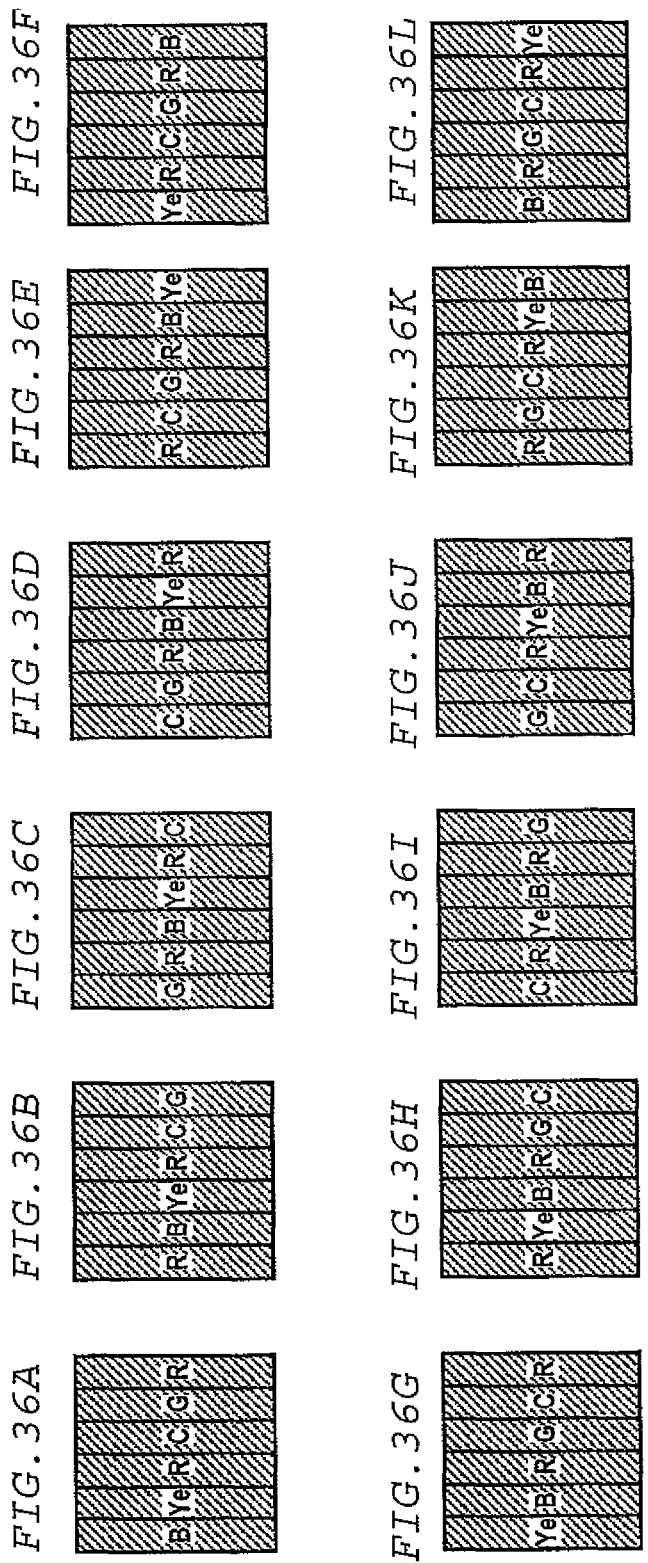

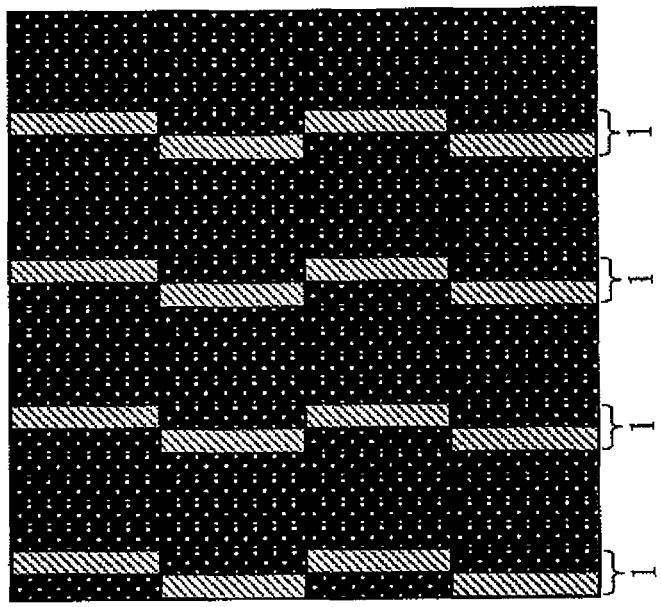
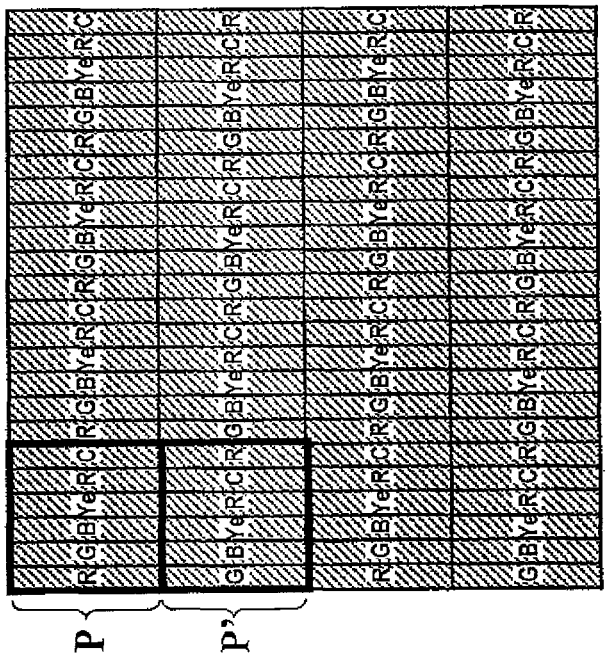
FIG. 40A  FIG. 40B  FIG. 40C

DISPLAY DEVICE

BACKGROUND OF THE INVENTION

1. Field of the Invention

The present invention relates to a display device, and more particularly, to a multi-primary display device which performs display by using four or more primary colors.

2. Description of the Related Art

Currently, various display devices are used in a variety of applications. In commonly-used display devices, each pixel is composed of three subpixels for displaying three primary colors of light, i.e., red, green and blue, whereby multicolor display is achieved.

A problem of conventional display devices is that they can only display colors in a limited range (referred to as a "color gamut"). FIG. 49 shows a color gamut of a conventional display device which performs display by using three primary colors. FIG. 49 is an xy chromaticity diagram in an XYZ color system, where a color gamut is shown by a triangle whose apices are at three points corresponding to the three primary colors of red, green and blue. Also shown in the figure are colors of various objects in nature, plotted with "X" symbols, as taught by Pointer (see M. R. Pointer, "The Gamut of Real Surface Colors," Color Research and Application, Vol. 5, No. 3, pp. 145-155 (1980)). As can be seen from FIG. 49, there are some object colors which do not fall within the color gamut. Thus, display devices which perform display by using three primary colors are unable to display certain object colors.

Therefore, in order to broaden the color gamut of a display device, there has been proposed a technique which increases the number of primary colors to be used for displaying to four or more.

For example, as shown in FIG. 50, Japanese National Phase PCT Laid-Open Publication No. 2004-529396 discloses a liquid crystal display device 800 each of whose pixels P is composed of six subpixels R, G, B, Ye, C and M for displaying red, green, blue, yellow, cyan, and magenta, respectively. The color gamut of the liquid crystal display device 800 is shown in FIG. 51. As shown in FIG. 51, a color gamut which is represented as a hexagonal shape whose apices are at six points corresponding to the six primary colors substantially encompasses all object colors. Thus, the color gamut can be broadened by increasing the number of primary colors to be used for displaying. In the present specification, any display device which performs display by using four or more primary colors will be generally referred to as a "multi-primary display device".

However, the inventors have performed a detailed study concerning the display quality of multi-primary display devices, and thus found that sufficient display quality cannot be achieved by merely increasing the number of primary colors. For example, in accordance with the display device disclosed in Japanese National Phase PCT Laid-Open Publication No. 2004-529396, the actually-displayed red colors will appear blackish, i.e., dark red, which means that there actually exist some object colors that cannot be displayed.

SUMMARY OF THE INVENTION

In view of the above problems, preferred embodiments of the present invention provide a display device which has a wide color gamut and is able to display bright red.

A display device according to a preferred embodiment of the present invention is a display device including a plurality of pixels each defined by a plurality of subpixels, wherein, the plurality of subpixels include first and second red subpixels for displaying red, a green subpixel for displaying green, a blue subpixel for displaying blue, and a yellow subpixel for displaying yellow; and the blue subpixel and the yellow subpixel are contiguous with each other.

In a preferred embodiment, the blue subpixel, the yellow subpixel, and the first or second red subpixel are contiguously arranged in this order.

In a preferred embodiment, the green subpixel, the blue subpixel, the yellow subpixel, and the first or second red subpixel are contiguously arranged in this order.

In a preferred embodiment, the plurality of subpixels further include a cyan subpixel for displaying cyan; and one of the first and second red subpixels, the green subpixel, the blue subpixel, the yellow subpixel, the other of the first and second red subpixels, and the cyan subpixel are contiguously arranged in this order.

In a preferred embodiment, the plurality of subpixels further include a cyan subpixel for displaying cyan; and the cyan subpixel, the green subpixel, the blue subpixel, the yellow subpixel, one of the first and second red subpixels, and the other of the first and second red subpixels are contiguously arranged in this order.

In a preferred embodiment, the plurality of subpixels further include a cyan subpixel for displaying cyan; and the cyan subpixel, the blue subpixel, the yellow subpixel, and the first or second red subpixel are contiguously arranged in this order.

In a preferred embodiment, one of the first and second red subpixels, the cyan subpixel, the blue subpixel, the yellow subpixel, the other of the first and second red subpixels, and the green subpixel are contiguously arranged in this order.

In a preferred embodiment, the green subpixel, the cyan subpixel, the blue subpixel, the yellow subpixel, one of the first and second red subpixels, and the other of the first and second red subpixels are contiguously arranged in this order.

In a preferred embodiment, the green subpixel, one of the first and second red subpixels, the blue subpixel, the yellow subpixel, and the other of the first and second red subpixels are contiguously arranged in this order.

In a preferred embodiment, the plurality of subpixels further include a cyan subpixel for displaying cyan; and in each of the plurality of pixels, one of the first and second red subpixels, the cyan subpixel, the green subpixel, the other of the first and second red subpixels, the blue subpixel, and the yellow subpixel are contiguously arranged in this order.

In a preferred embodiment, in each of the plurality of pixels, at least one of the blue subpixel and the yellow subpixel is interposed between other subpixels.

In a preferred embodiment, in each of the plurality of pixels, the blue subpixel and the yellow subpixel are contiguously arranged, and are interposed between other subpixels.

In a preferred embodiment, the blue subpixel and the yellow subpixel that are contiguously arranged are located near a center of the pixel.

Alternatively, a display device according to a preferred embodiment of the present invention is a display device including a plurality of pixels each defined by a plurality of subpixels disposed in one row by multiple columns, wherein, the plurality of subpixels include first and second red subpixels for displaying red, a green subpixel for displaying green, a blue subpixel for displaying blue, and a yellow subpixel for displaying yellow; and between two pixels adjoining along a column direction, the plurality of subpixels have different arrangements.

In a preferred embodiment, between two pixels adjoining along the column direction, at least one of the green subpixel and the yellow subpixel belongs to different columns.

In a preferred embodiment, between two pixels adjoining along the column direction, both of the green subpixel and the yellow subpixel belong to different columns.

Alternatively, a display device according to a preferred embodiment of the present invention is a display device including a plurality of pixels each defined by a plurality of subpixels disposed in multiple rows by multiple columns, wherein, the plurality of subpixels include first and second red subpixels for displaying red, a green subpixel for displaying green, a blue subpixel for displaying blue, and a yellow subpixel for displaying yellow; and between two pixels adjoining along a row direction, the plurality of subpixels have different arrangements.

In a preferred embodiment, between two pixels adjoining along the row direction, at least one of the green subpixel and the yellow subpixel belongs to different rows.

In a preferred embodiment, between two pixels adjoining along the row direction, both of the green subpixel and the yellow subpixel belong to different rows.

In a preferred embodiment, the display device according to the present invention is a liquid crystal display device including a liquid crystal layer.

In a preferred embodiment, the first and second red subpixels each have a Y value of no less than about 5% and no more than about 11%; the green subpixel has a Y value of no less than about 20% and no more than about 35%; the blue subpixel has a Y value of no less than about 5% and no more than about 10%; and the yellow subpixel has a Y value of no less than about 30% and no more than about 50%, where a Y value in the XYZ color system of each pixel when displaying white is defined as 100%, for example.

In a preferred embodiment, the first and second red subpixels each have a dominant wavelength of no less than about 605 nm and no more than about 635 nm; the green subpixel has a dominant wavelength of no less than about 520 nm and no more than about 550 nm; the blue subpixel has a dominant wavelength of no more than about 470 nm; and the yellow subpixel has a dominant wavelength of no less than about 565 nm and no more than about 580 nm, for example.

In a preferred embodiment, the first and second red subpixels each have a color purity of no less than about 90%; the green subpixel has a color purity of no less than about 65% and no more than about 80%; the blue subpixel has a color purity of no less than about 90% and no more than about 95%; and the yellow subpixel has a color purity of no less than about 85% and no more than about 95%, for example.

In a preferred embodiment, the plurality of subpixels are of substantially the same size.

In a preferred embodiment, the first and second red subpixels are driven independently of each other.

In a preferred embodiment, the first and second red subpixels are driven by a same switching element.

In a preferred embodiment, the cyan subpixel has a Y value of no less than about 10% and no more than about 30%, where a Y value in the XYZ color system of each pixel when displaying white is defined as 100%, for example.

In a preferred embodiment, the cyan subpixel has a dominant wavelength of no less than about 475 nm and no more than about 500 nm, for example.

In a preferred embodiment, the cyan subpixel has a color purity of no less than about 65% and no more than about 80%, for example.

Each pixel of a display device according to a preferred embodiment of the present invention includes not only subpixels for displaying red, green, and blue, but also subpixels for displaying other colors. In other words, more than three primary colors are used for displaying by the display device according to a preferred embodiment of the present invention, thus resulting in a color gamut which is wider than that of a conventional display device which uses three primaries for displaying. Moreover, each pixel of the display device according to a preferred embodiment of the present invention includes two subpixels for displaying red, whereby the Y value of red can be improved and bright red can be displayed.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 27A to 27L are diagrams showing preferable examples of subpixel arrangement.

FIGS. 29A to 29L are diagrams showing preferable examples of subpixel arrangement.

FIGS. 30A to 30L are diagrams showing preferable examples of subpixel arrangement.

FIGS. 31A to 31L are diagrams showing preferable examples of subpixel arrangement.

FIGS. 32A to 32L are diagrams showing preferable examples of subpixel arrangement.

FIGS. 33A to 33L are diagrams showing preferable examples of subpixel arrangement.

FIGS. 34A to 34L are diagrams showing preferable examples of subpixel arrangement.

FIGS. 35A to 35L are diagrams showing preferable examples of subpixel arrangement.

FIGS. 36A to 36L are diagrams showing preferable examples of subpixel arrangement.

FIGS. 40A to 40C are diagrams for explaining reasons why a decrease in line width can be prevented by adopting a certain subpixel arrangement in a multi-primary display device.

DETAILED DESCRIPTION OF THE PREFERRED EMBODIMENTS

Before describing preferred embodiments of the present invention, the reason why red appears blackish (dark) in the liquid crystal display device 800 disclosed in Japanese National Phase PCT Laid-Open Publication No. 2004-529396 will be described.

When the number of primary colors to be used for displaying is increased, the number of subpixels per pixel increases, which inevitably reduces the area of each subpixel. This results in a lowered lightness (which corresponds to the Y value in the XYZ color system) of the color to be displayed by each subpixel. For example, if the number of primary colors used for displaying is increased from three to six, the area of each subpixel is reduced to about half, so that the lightness (Y value) of each subpixel is also reduced to about half.

Figure 51:
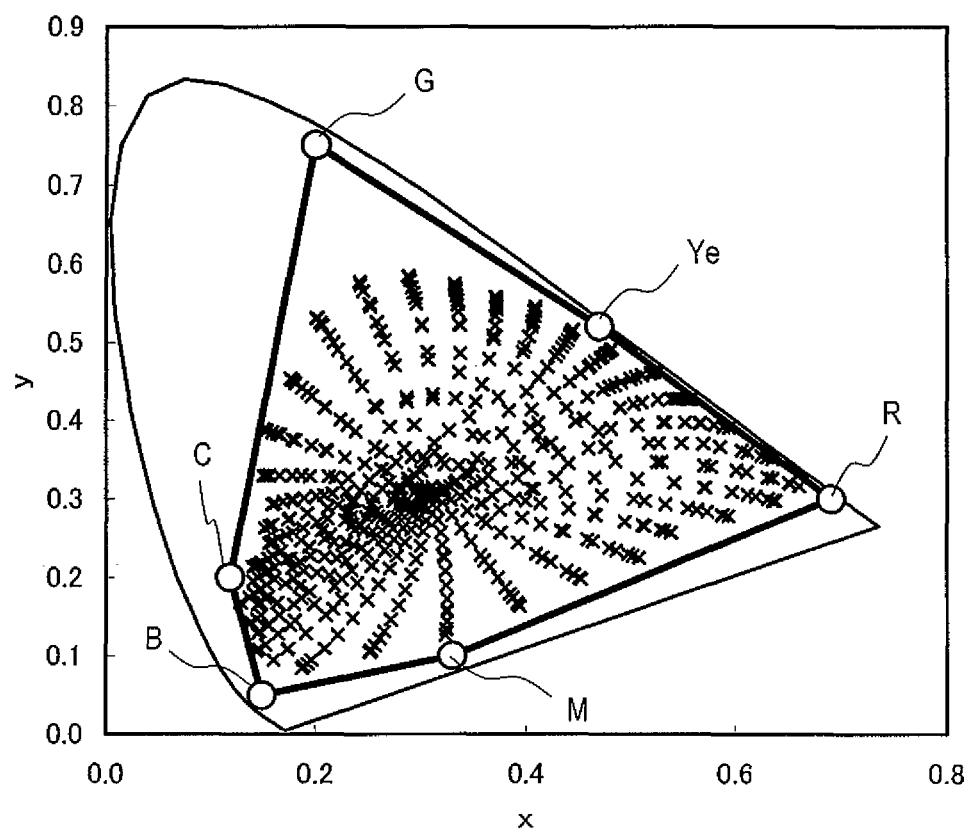
FIG. 51 is a diagram showing a color gamut of the liquid crystal display device 800.

"Brightness" is one of the three factors which define a color, the other two being "hue" and "chroma". Therefore, even if the color gamut on the xy chromaticity diagram (i.e., reproducible range of "hue" and "chroma") may be broadened by increasing the number of primary colors as shown in FIG. 51, the lowered "lightness" prevents the actual color gamut (i.e., the color gamut which also takes "lightness" into account) from becoming sufficiently broad.

According to a study by the inventors, while subpixels for displaying green and blue can still sufficiently display various object colors under lowered lightness, it is the subpixels for displaying red that become unable to display some object colors under lowered lightness. If the lightness (Y value) becomes lower because of using an increased number of primary colors, the display quality of red is degraded such that red appears blackish red (i.e., dark red).

The present invention has been made based on the above findings. Hereinafter, preferred embodiments of the present invention will be described with reference to the figures. Although the following descriptions will be directed to liquid crystal display devices as an example, the present invention can be suitably used for various display devices such as CRTs (cathode-ray tubes), organic EL display devices, plasma display panels, and SEDs (Surface-conduction Electron-emitter Displays), as well as liquid crystal display devices.

Figure 1:
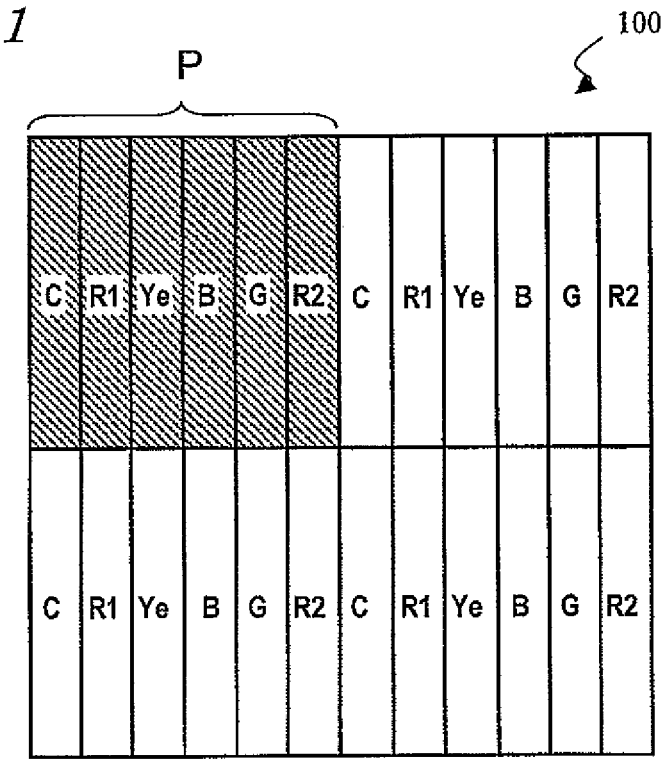
FIG. 1 is a diagram schematically showing a liquid crystal display device 100 according to a preferred embodiment of the present invention.

FIG. 1 schematically shows a liquid crystal display device 100 according to the present preferred embodiment. The liquid crystal display device 100 includes a plurality of pixels in a matrix arrangement. FIG. 1 shows four pixels P among the plurality of pixels of the liquid crystal display device 100.

As shown in FIG. 1, each pixel P is defined by a plurality of subpixels, namely: first and second red subpixels R1 and R2 for displaying red; a green subpixel G for displaying green; a blue subpixel B for displaying blue; a yellow subpixel Ye for displaying yellow; and a cyan subpixel C for displaying cyan. FIG. 1 shows a case where these subpixels are arranged in one row by multiple columns within the pixel P.

Figure 2:
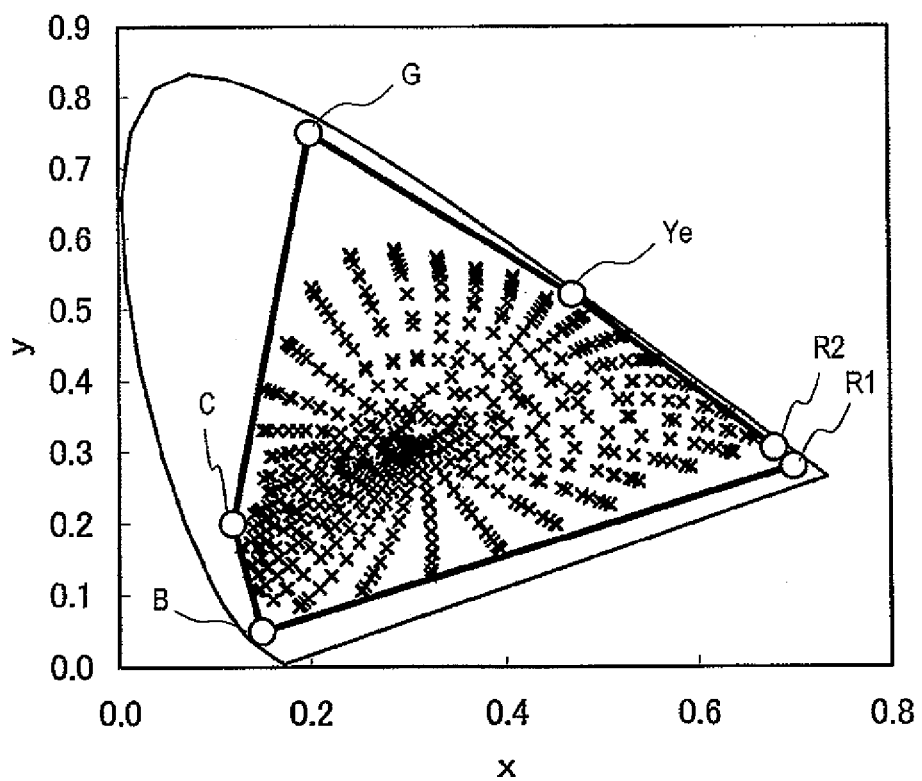
FIG. 2 is a diagram showing a color gamut of the liquid crystal display device 100.

The liquid crystal display device 100 according to a preferred embodiment of the present invention has a wide color gamut because it uses more primary colors for displaying than any commonly-used liquid crystal display device that uses three primaries to perform display. FIG. 2 shows an exemplary color gamut of the liquid crystal display device 100. As shown in FIG. 2, the color gamut of the liquid crystal display device 100 encompasses various object colors.

Note that the color gamut shown in FIG. 2 preferably has a hexagonal shape. This is because the red which is displayed by the first red subpixel R1 is different from the red which is displayed by the second red subpixel R2. It will be appreciated that the red displayed by the first red subpixel R1 may be identical to the red displayed by the second red subpixel R2, in which case the color gamut will have a pentagonal shape. In either case, the color gamut can be improved over that of a commonly-used liquid crystal display device whose color gamut has a triangular shape.

Figure 50:
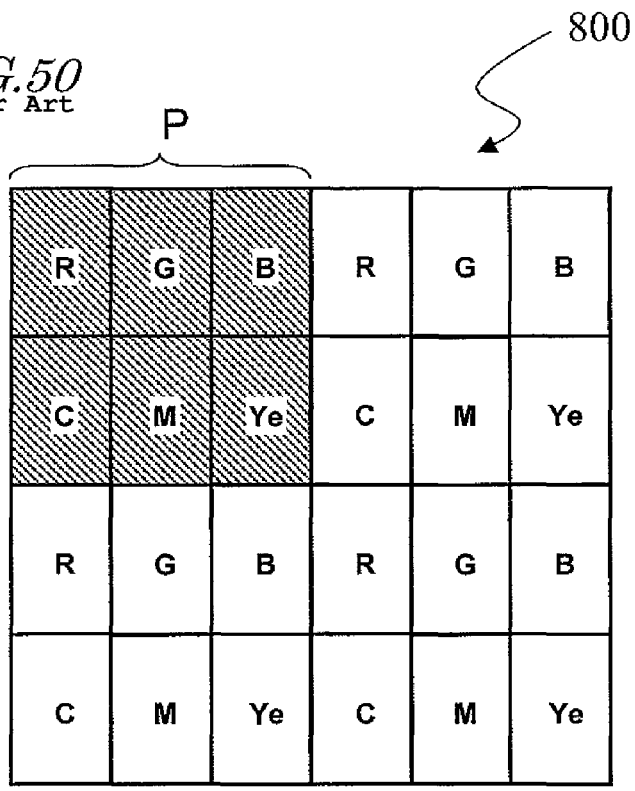
FIG. 50 is a diagram schematically showing a conventional multi-primary liquid crystal display device 800.

Moreover, since each pixel of the liquid crystal display device 100 according to a preferred embodiment of the present invention includes two subpixels for displaying red (i.e., first and second subpixels R1 and R2), the lightness (Y value) of red can be improved over that of the liquid crystal display device 800 shown in FIG. 50. Thus, bright red can be displayed. In other words, there is provided a wide color gamut which takes into account not only the hue and chroma on the xy chromaticity diagram but also lightness.

Now, improvement in the Y value of the liquid crystal display device 100 will be specifically described, in comparison with the multi-primary liquid crystal display device 800 of Japanese National Phase PCT Laid-Open Publication No. 2004-529396.

Figure 3:
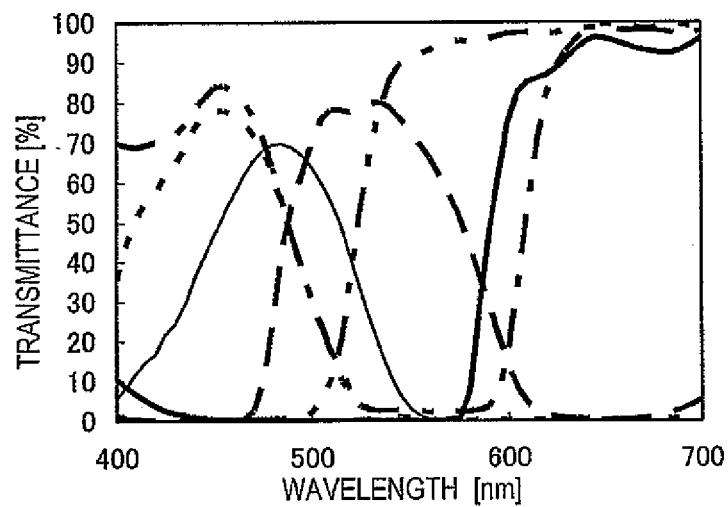
FIG. 3 is a graph showing spectral transmittance characteristics of color filters corresponding to a construction illustrated in Table 1.
Figure 4:
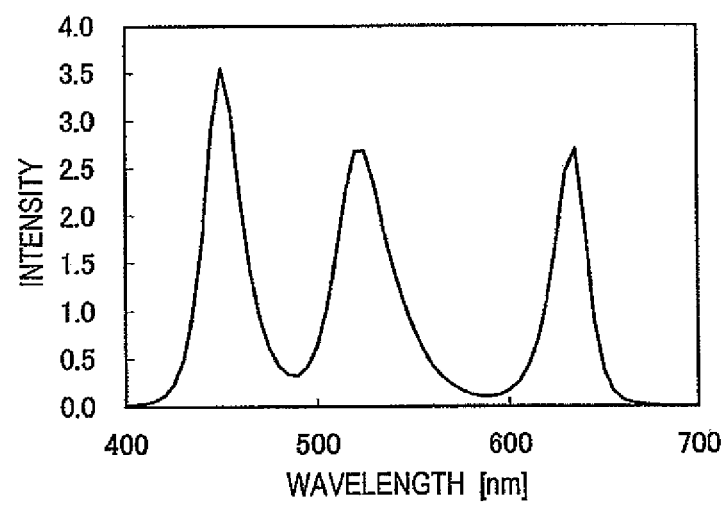
FIG. 4 is a graph showing a spectrum of backlight corresponding to the construction illustrated in Table 1.

Table 1 exemplifies a Y value, xy chromaticity, dominant wavelength (or complementary wavelength for magenta), and color purity of each subpixel, as well as its display quality, in the multi-primary liquid crystal display device 800 of Japanese National Phase PCT Laid-Open Publication No. 2004-529396. Table 1 also shows a Y value, xy chromaticity, and color temperature of the case where the pixel is displaying white. The Y value of each subpixel represents a relative value taken against the Y value of the pixel when displaying white (defined as 100%). The dominant wavelength and complementary wavelength roughly represent hue. The color purity roughly represents chroma. Moreover, FIG. 3 and FIG. 4 show spectral transmittance characteristics of color filters and a backlight spectrum, respectively, that correspond to this illustrated construction.

TABLE 1

|  | W | R | Ye | G | C | B | M |
|---|---|---|---|---|---|---|---|
| Y [%] | 100 | 8.1 | 33.6 | 31.6 | 11.9 | 3.9 | 11.2 |
| x | 0.285 | 0.684 | 0.446 | 0.177 | 0.132 | 0.147 | 0.293 |
| y | 0.293 | 0.299 | 0.534 | 0.727 | 0.224 | 0.061 | 0.122 |
| DOMINANT WAVELENGTH [nm] | 9233* | 625 | 571 | 528 | 486 | 465 | 562* |
| COLOR PURITY [%] |  | 96 | 94 | 82 | 75 | 93 | 74 |
| DISPLAY QUALITY |  | X | X | ◎ | ○ | X | ◎ |

*COLOR TEMPERATURE (K)
*COMPLEMENTARY WAVELENGTH (nm)

As shown in Table 1, the subpixels R, B and Ye for displaying red, blue and yellow have a poor display quality. Moreover, the subpixel C for displaying cyan has a slightly inferior display quality to those of the subpixels G and M for displaying green and magenta. Note however that the results shown in Table 1 do not immediately apply to the primary colors that are used for displaying. The reason is that yellow, cyan and magenta can always be displayed through additive mixing of red, green and blue. Therefore, each of these colors (cyan, yellow, magenta) must be evaluated with respect to both of: the color which is displayed by the subpixel Ye, C or M alone; and a color which is displayed through additive color mixing.

Specifically, yellow must be evaluated with respect to both of: a yellow color which is displayed through mixing of the red which is displayed by the red subpixel R and the green which is displayed by the green subpixel G; and a yellow color which is displayed by the yellow subpixel Ye alone. Cyan must be evaluated with respect to both of: a cyan color which is displayed through mixing of the green which is displayed by the green subpixel G and the blue which is displayed by the blue subpixel B; and a cyan color which is displayed by the cyan subpixel C alone. Magenta must be evaluated with respect to both of: a magenta color which is displayed through mixing of the red which is displayed by the red subpixel R and the blue which is displayed by the blue subpixel B; and a magenta color which is displayed by the magenta subpixel M alone.

Table 2 exemplifies a Y value, xy chromaticity, dominant wavelength (or complementary wavelength for magenta), and color purity of each of the primary colors used for displaying by the liquid crystal display device 800, as well as its display quality.

TABLE 2

|  | W | R | Ye* | G | C* | B | M* |
|---|---|---|---|---|---|---|---|
| Y [%] | 100 | 8.1 | 73.1 | 31.6 | 47.2 | 3.9 | 23.0 |
| x | 0.285 | 0.684 | 0.407 | 0.177 | 0.149 | 0.147 | 0.300 |
| y | 0.293 | 0.299 | 0.550 | 0.727 | 0.296 | 0.061 | 0.126 |
| DOMINANT WAVELENGTH [nm] |  | 630 | 566 | 528 | 489 | 465 | 561† |
| COLOR PURITY [%] |  | 94 | 87 | 82 | 65 | 93 | 74 |
| DISPLAY QUALITY |  | X | ⊚ | ⊚ | ⊚ | X | ⊚ |

*Ye = R + Ye + G
*C = G + C + B
*M = R + B + M
†COMPLEMENTARY WAVELENGTH (nm)

It can be seen from Table 2 that a sufficient display quality is obtained also for yellow and cyan. This is a result of a greatly improved Y value, which in turn is obtained by taking into account (almost via a simple arithmetic sum) the color which is created through additive color mixing of other subpixels.

However, as shown in Table 2, the display quality for red is still low. This is because the Y value has become lower due to the increased number of primary colors. Incidentally, it appears that the display quality for blue is also low in the illustrated example. However, this is ascribable to an excessively low Y value which is associated with the specifications of the color filters and backlight that were used in this particular prototype. The low Y value for blue is not an essential problem because it can be overcome by changing the specifications of the color filters and backlight.

Figure 5:
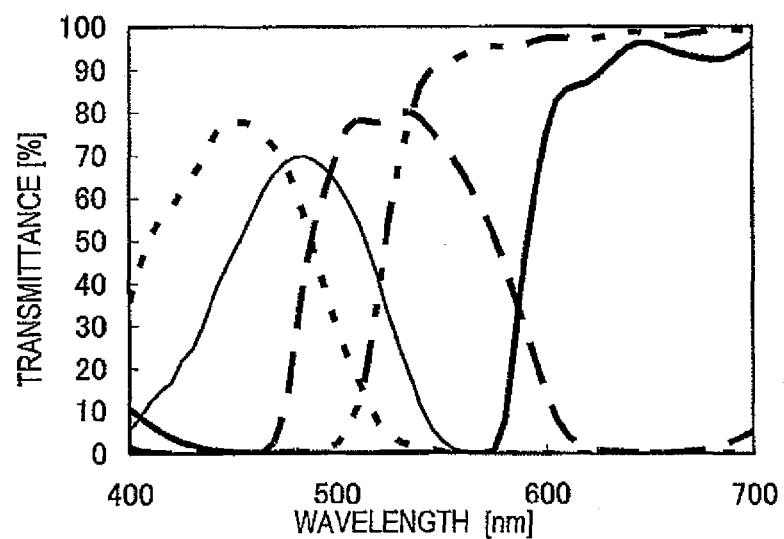
FIG. 5 is a graph showing spectral transmittance characteristics of color filters corresponding to a construction illustrated in Table 3.
Figure 6:
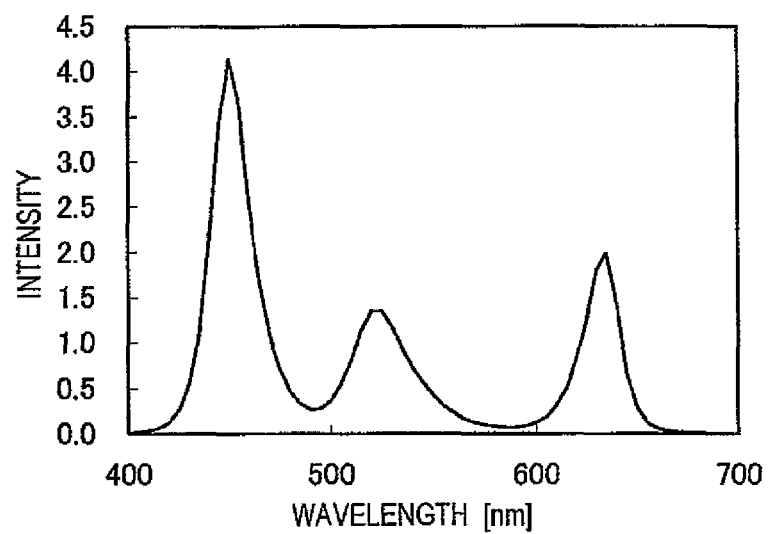
FIG. 6 is a graph showing a spectrum of backlight corresponding to the construction illustrated in Table 3.

Next, Table 3 exemplifies a Y value, xy chromaticity, dominant wavelength, and color purity of each subpixel, as well as its display quality, in the liquid crystal display device 100 according to a preferred embodiment of the present invention. Moreover, FIG. 5 and FIG. 6 show spectral transmittance characteristics of color filters and a backlight spectrum, respectively, that correspond to this illustrated construction.

slightly inferior to those of the green subpixel G and the blue subpixel B. However, also in the liquid crystal display device 100 according to a preferred embodiment of the present invention, the results shown in Table 3 do not immediately apply to the primary colors that are used for displaying. In other words, each display quality shown in Table 3 merely represents a "display quality of a subpixel", rather than a "display quality of a primary color" that is used for displaying.

As has already been described, yellow and cyan must be evaluated with respect to both of: a color which is displayed by the yellow subpixel Ye or the cyan subpixel C alone; and a color which is displayed through additive color mixing. Red must be evaluated with respect to both of the red which is displayed by the first red subpixel R1 and the red which is displayed by the second red subpixel R2. In the liquid crystal display device 100 according to a preferred embodiment of the present invention, too, magenta can be displayed through color mixing (i.e., mixing of the red colors displayed by the first and second red subpixels R1 and R2 and the blue displayed by the blue subpixel B).

Table 4 exemplifies a Y value, xy chromaticity, dominant wavelength (or complementary wavelength for magenta), and

TABLE 3

|  | W | R1 | R2 | Ye | G | C | B |
|---|---|---|---|---|---|---|---|
| Y [%] | 100 | 10.5 | 10.5 | 32.7 | 29.0 | 12.1 | 5.4 |
| x | 0.302 | 0.681 | 0.681 | 0.496 | 0.177 | 0.139 | 0.149 |
| y | 0.250 | 0.296 | 0.296 | 0.488 | 0.707 | 0.130 | 0.042 |
| DOMINANT WAVELENGTH [nm] | 9594* | 630 | 630 | 579 | 527 | 476 | 460 |
| COLOR PURITY [%] |  | 93 | 93 | 95 | 77 | 86 | 96 |
| DISPLAY QUALITY |  | X | X | X | ⊚ | ○ | ⊚ |

*COLOR TEMPERATURE (K)

As seen from Table 3, when looking at each subpixel alone, it appears that the first red subpixel R1, the second red subpixel R2, and the yellow subpixel Ye have a poor display quality. The display quality of the cyan subpixel C is also color purity of each of the primary colors used for displaying by the liquid crystal display device 100 according to a preferred embodiment of the present invention, as well as its display quality.

TABLE 4

|  | W | R* | Ye* | G | C* | B | M* |
|---|---|---|---|---|---|---|---|
| Y [%] | 100 | 20.9 | 72.0 | 29.0 | 46.4 | 5.4 | 26.2 |
| x |  | 0.302 | 0.681 | 0.451 | 0.177 | 0.150 | 0.149 | 0.338 |
| y |  | 0.250 | 0.296 | 0.504 | 0.707 | 0.177 | 0.042 | 0.132 |
| DOMINANT WAVELENGTH [nm] |  | 630 | 573 | 527 | 479 | 460 | 553† |
| COLOR PURITY [%] |  | 94 | 86 | 77 | 76 | 96 | 80 |
| DISPLAY QUALITY |  | ◎ | ◎ | ◎ | ◎ | ◎ | ◎ |

*R = R1 + R2
*Ye = R1 + R2 + Ye + G
*C = G + C + B
*M = R1 + R2 + B
†COMPLEMENTARY WAVELENGTH (nm)

As can be seen from Table 4, a very good display quality is obtained for yellow and cyan, and also for magenta. Furthermore, red also has a greatly improved Y value, thus resulting in a substantially improved display quality.

Now, the difference in red reproduction range between the liquid crystal display device 100 according to a preferred embodiment of the present invention and the liquid crystal display device 800 of Japanese National Phase PCT Laid-Open Publication No. 2004-529396 will be described more specifically.

Figure 7:
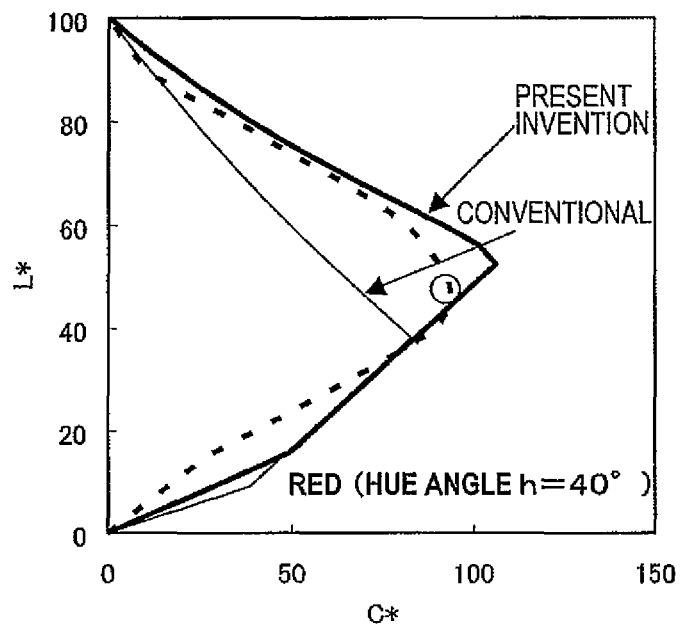
FIG. 7 is a graph showing C*-L* characteristics, with respect to red, of a liquid crystal display device 800 in Japanese National Phase PCT Laid-Open Publication No. 2004-529396 and the liquid crystal display device 100 according to a preferred embodiment of the present invention.

FIG. 7 shows C*-L* characteristics, with respect to red, of the liquid crystal display device 800 of Japanese National Phase PCT Laid-Open Publication No. 2004-529396 and the liquid crystal display device 100 according to a preferred embodiment of the present invention. FIG. 7 is a graph showing a relationship between C* and L*, with respect to a hue angle h=40° (corresponding to red) in the L*C*h color system. C* corresponds to T [(a*)²+(b*)²] in the L*a*b* color system, and represents chroma. L* corresponds to the Y value in the XYZ color system, and represents lightness. Also shown in FIG. 7 is a red range of object colors (dotted line).

As can be seen from FIG. 7, the liquid crystal display device 800 is unable to cover all of the red range of object colors because of the low lightness (L*) of red. On the other hand, the liquid crystal display device 100 according to a preferred embodiment of the present invention covers all of the red range of object colors because of the high lightness of red. In particular, the liquid crystal display device 100 according to a preferred embodiment of the present invention is able to reproduce a red color of the highest chroma (shown encircled in FIG. 7), i.e., the vividest red color. Therefore, the color gamut is broadened, and bright red can be displayed.

Note that the liquid crystal display device 100 according to a preferred embodiment of the present invention lacks any subpixels for displaying magenta, whereas the liquid crystal display device 800 of Japanese National Phase PCT Laid-Open Publication No. 2004-529396 includes subpixels for displaying magenta. The inventors have also studied the impact of this omission on the displaying of magenta.

Figure 8:
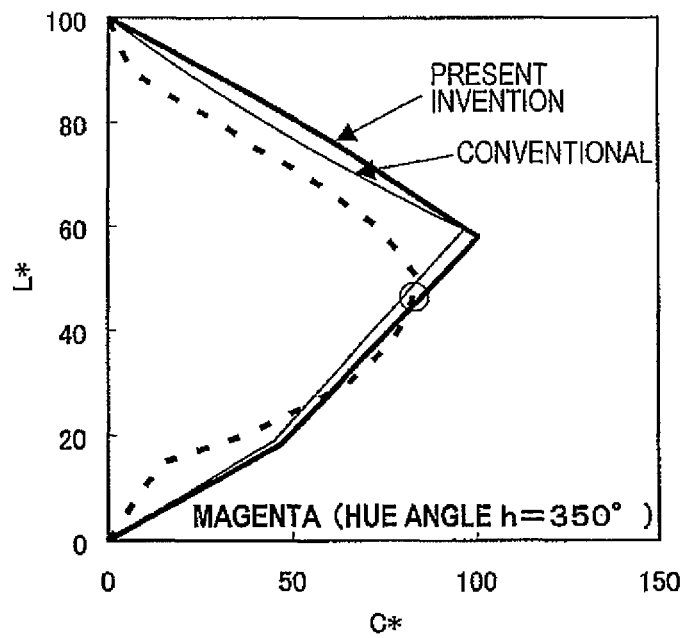
FIG. 8 is a graph showing C*-L* characteristics, with respect to magenta, of a liquid crystal display device 800 in Japanese National Phase PCT Laid-Open Publication No. 2004-529396 and the liquid crystal display device 100 according to a preferred embodiment of the present invention.

FIG. 8 shows C*-L* characteristics, with respect to magenta, of the liquid crystal display device 800 of Japanese National Phase PCT Laid-Open Publication No. 2004-529396 and the liquid crystal display device 100 according to a preferred embodiment of the present invention. FIG. 8 is a graph showing a relationship between C* and L*, with respect to a hue angle h=350° (corresponding to magenta) in the L*C*h color system. Also shown in FIG. 8 is a magenta range of object colors (dotted line).

As can be seen from FIG. 8, in the liquid crystal display device 800 which includes a magenta subpixel in each pixel, the magenta range of object colors is substantially covered; that is, magenta of the highest chroma (shown encircled in FIG. 8) can be reproduced. The liquid crystal display device 100 according to a preferred embodiment of the present invention also substantially covers the magenta range of object colors, in spite of the omission of magenta subpixels, and is able to reproduce magenta of the highest chroma (i.e., vividest magenta). As can be seen from FIG. 8, the liquid crystal display device 100 according to a preferred embodiment of the present invention even covers a slightly broader range.

The reason why magenta object colors can be sufficiently reproduced even if magenta subpixels are omitted is that, as shown in FIG. 2, the magenta range of object colors has an almost linear extent, so that magenta object colors can be sufficiently reproduced through additive color mixing so long as the red subpixels R1 and R2 and the blue subpixel B have a sufficiently high color purity. On the other hand, the yellow and cyan ranges of object colors have a rounded extent as shown in FIG. 2, and therefore yellow and cyan object colors are difficult to be reproduced unless yellow subpixels Ye and cyan subpixels C are provided.

As described above, a liquid crystal display device according to a preferred embodiment of the present invention has a wide color gamut, and is able to display bright red. Note that the red which is displayed by the first red subpixel R1 and the red which is displayed by the second red subpixel R2 may be identical or different. In the case where they are identical, the manufacturing process of color filters can be shortened. In the case where they are different, there are six primary colors to be displayed by the subpixels (i.e., the color gamut has a hexagonal shape on the chromaticity diagram), and therefore the number of reproducible colors (in particular the number of displayed colors in the vicinity of red) increases.

Next, preferable ranges for the Y value, dominant wavelength, and color purity of each subpixel of the liquid crystal display device 100 will be discussed.

In order to achieve highly true color reproduction, it is preferable to determine the lightness (i.e., Y value) of each primary color used for displaying in accordance with the lightness of object colors. FIGS. 9A to 9C and FIGS. 10A to 10C show C*-L* characteristics of object colors, with respect to red) (h=40°), green (h=160°), blue (h=310°), yellow (h=90°), cyan (h=220°), and magenta (h=350°).

Figure 9A:
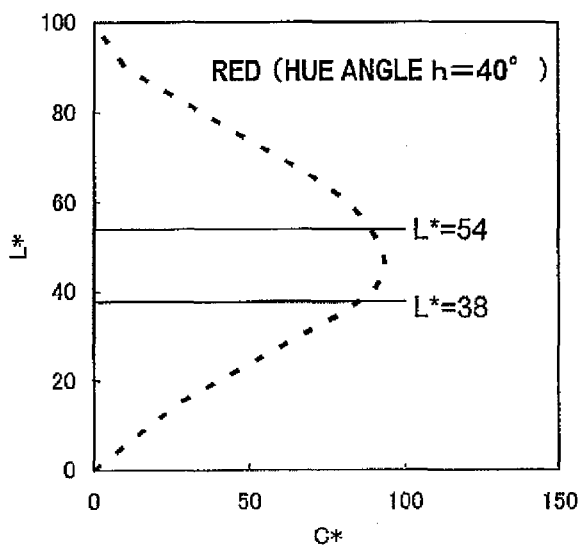
FIGS. 9A to 9C are graphs showing C*-L* characteristics of object colors, with respect to red, green and blue, respectively.
Figure 9B:
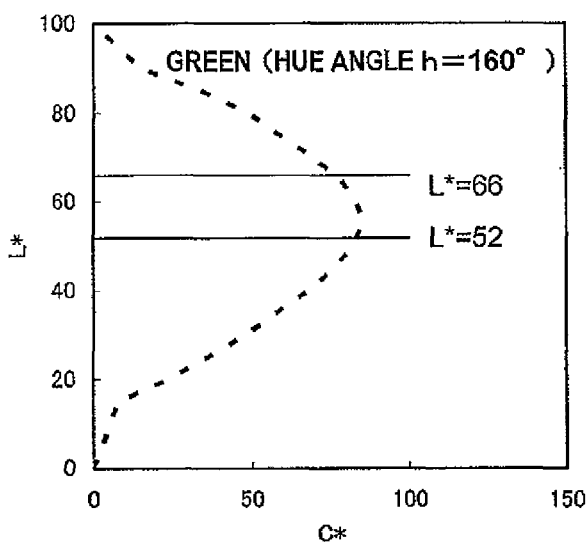
Figure 9C:
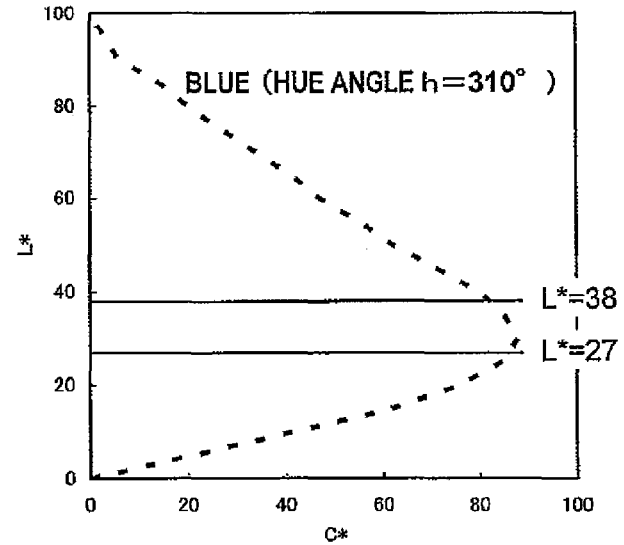

In order to reproduce colors of high chroma, as shown in FIGS. 9A to 9C, it is preferable that: red has an L* of no less than 38 and no more than 54; green has an L* of no less than 52 and no more than 66; and blue has an L* of no less than 27 and no more than 38. Since L* and the Y value satisfy a relationship of $L^*=116 \cdot Y^{1/3}-16$, when this condition is expressed in terms of the Y value instead of L*, it is preferable that: red has a Y value of no less than about 10% and no more than about 22%; green has a Y value of no less than about 20% and no more than about 35%; and blue has a Y value of no less than about 5% and no more than about 10%.

Figure 10A:
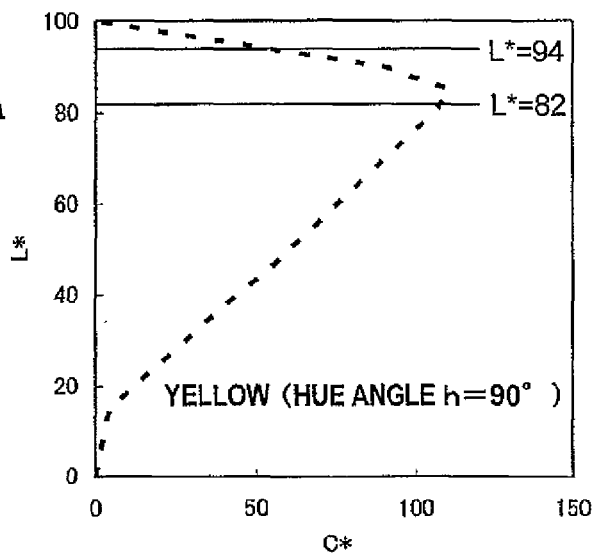
FIGS. 10A to 10C are graphs showing C*-L* characteristics of object colors, with respect to yellow, cyan and magenta, respectively.
Figure 10B:
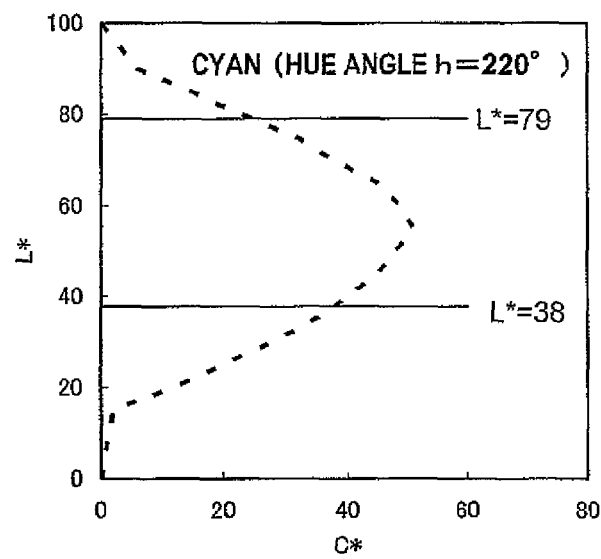
Figure 10C:
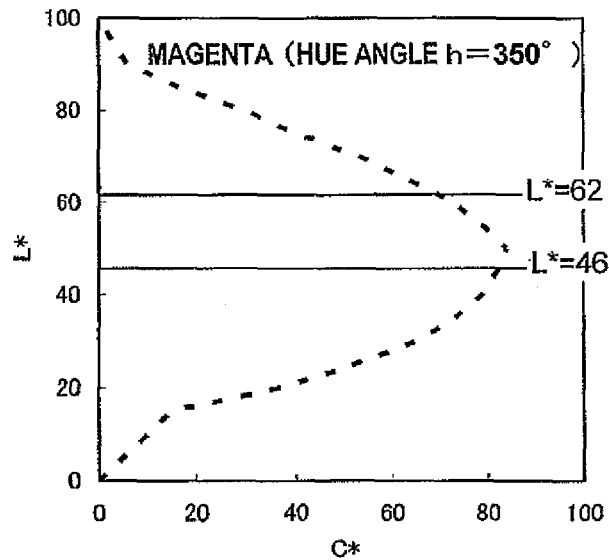

Similarly, in order to reproduce colors of high chroma, as shown in FIGS. 10A to 10C, it is preferable that: yellow has an L* of no less than 82 and no more than 94; cyan has an L* of no less than 38 and no more than 79; and magenta has an L* of no less than 46 and no more than 62. When this condition is expressed in terms of the Y value instead of L*, it is preferable that: yellow has a Y value of no less than about 60% and no more than about 85%; cyan has a Y value of no less than about 10% and no more than about 55%; and magenta has a Y value of no less than about 15% and no more than about 30%.

When the Y value is too low, a blackish color will result even if the chroma may be high. For example, red will appear as scarlet, yellow as ocher, and green or blue as black. Conversely, if the Y value is too high, the display will resemble luminous colors, which would be odd. This tendency is especially true of red and green. As for cyan, good displaying can be obtained in a relatively broad range of Y values, as can be seen from FIG. 10B.

Table 5 shows preferable ranges for the Y value, dominant wavelength, and color purity of each primary color used for displaying by the liquid crystal display device 100.

TABLE 5

| | Y value (a value where white displaying is defined as 100%) | dominant wavelength | color purity |
|---|---|---|---|
| R(=R1 + R2) | no less than 10%, no more than 22% | no less than 605 nm, no more than 635 nm | no less than 90% |
| Ye(=R1 + R2 + Ye + G) | no less than 60%, no more than 85% | no less than 565 nm, no more than 580 nm | no less than 85%, no more than 95% |
| G | no less than 20%, no more than 35% | no less than 520 nm, no more than 550 nm | no less than 65%, no more than 80% |
| C(=G + C + B) | no less than 10%, no more than 55% | no less than 475 nm, no more than 500 nm | no less than 65%, no more than 80% |
| B | no less than 5%, no more than 10% | no more than 470 nm | no less than 90%, no more than 95% |
| M(=R1 + R2 + B) | no less than 15%, no more than 30% | | no less than 60%, no more than 80% |

As has already been described, it is preferable that: red has a Y value of no less than about 10% and no more than about 22%; green has a Y value of no less than about 20% and no more than about 35%; blue has a Y value of no less than about 5% and no more than about 10%; yellow has a Y value of no less than about 60% and no more than about 85%; cyan has a Y value of no less than about 10% and no more than about 55%; and magenta has a Y value of no less than about 15% and no more than about 30%.

Moreover, it is preferable that: red has a dominant wavelength of no less than about 605 nm and no more than about 635 nm; green has a dominant wavelength of no less than about 520 nm and no more than about 550 nm; blue has a dominant wavelength of no more than about 470 nm; yellow has a dominant wavelength of no less than about 565 nm and no more than about 580 nm; and cyan has a dominant wavelength of no less than about 475 nm and no more than about 500 nm.

Furthermore, it is preferable that: red has a color purity of no less than about 90%; green has a color purity of no less than about 65% and no more than about 80%; blue has a color purity of no less than about 90% and no more than about 95%; yellow has a color purity of no less than about 85% and no more than about 95%; cyan has a color purity of no less than about 65% and no more than about 80%; and magenta has a color purity of no less than about 60% and no more than about 80%.

As for red, the first and second red subpixels R1 and R2 contribute to display. As for yellow, the first and second red subpixels R1 and R2, the yellow subpixel Ye, and the green subpixel G contribute to display. As for cyan, the green subpixel G, the cyan subpixel C, and the blue subpixel B contribute to display. As for magenta, the first and second red subpixels R1 and R2 and the blue subpixel B contribute to display. When these facts are taken into consideration, the preferable ranges for the dominant wavelength, Y value, and color purity of each subpixel of the liquid crystal display device 100 are as shown in Table 6.

TABLE 6

| | Y value (a value where white displaying is defined as 100%) | dominant wavelength | color purity |
|---|---|---|---|
| R1 · R2 | no less than 5%, no more than 11% | no less than 605 nm, no more than 635 nm | no less than 90% |
| Ye | no less than 30%, no more than 50% | no less than 565 nm, no more than 580 nm | no less than 85%, no more than 95% |
| G | no less than 20%, no more than 35% | no less than 520 nm, no more than 550 nm | no less than 65%, no more than 80% |
| C | no less than 10%, no more than 30% | no less than 475 nm, no more than 500 nm | no less than 65%, no more than 80% |
| B | no less than 5%, no more than 10% | no more than 470 nm | no less than 90%, no more than 95% |

As shown in Table 6, it is preferable that: the first and second red subpixels R1 and R2 each have a Y value of no less than about 5% and no more than about 11%; the green subpixel G has a Y value of no less than about 20% and no more than about 35%; the blue subpixel B has a Y value of no less than about 5% and no more than about 10%; the yellow subpixel Ye has a Y value of no less than about 30% and no more than about 50%; and the cyan subpixel C has a Y value of no less than about 10% and no more than about 30%.

Moreover, it is preferable that: the first and second red subpixels R1 and R2 each have a dominant wavelength of no less than about 605 nm and no more than about 635 nm; the green subpixel G has a dominant wavelength of no less than about 520 nm and no more than about 550 nm; the blue subpixel B has a dominant wavelength of no more than about 470 nm; the yellow subpixel Ye has a dominant wavelength of no less than about 565 nm and no more than about 580 nm; and the cyan subpixel C has a dominant wavelength of no less than about 475 nm and no more than about 500 nm.

Furthermore, it is preferable that: the first and second red subpixels R1 and R2 each have a color purity of no less than about 90%; the green subpixel G has a color purity of no less than about 65% and no more than about 80%; the blue subpixel B has a color purity of no less than about 90% and no more than about 95%; the yellow subpixel Ye has a color purity of no less than about 85% and no more than about 95%; and the cyan subpixel C has a color purity of no less than about 65% and no more than about 80%.

By prescribing the Y value, dominant wavelength, and color purity of each subpixel so as to be within the aforementioned preferable ranges, it becomes possible to enhance the effects of the present invention of broadening the color gamut and enabling displaying of bright red.

Now, results of producing a number of prototypes of the liquid crystal display device 100 according to a preferred embodiment of the present invention with varying color filter and backlight specifications, and examining their display qualities will be described. The examined results of display quality will be shown in Tables 7 to 20 below. It should be noted that each display quality recited in any of Tables 7, 9, 11, 13, 15, 17 and is a "display quality of a subpixel", whereas each display quality recited in any of Tables 8, 10, 12, 14, 16, 18 and 20 is a "display quality of a primary color".

EXAMPLE 1

Figure 11:
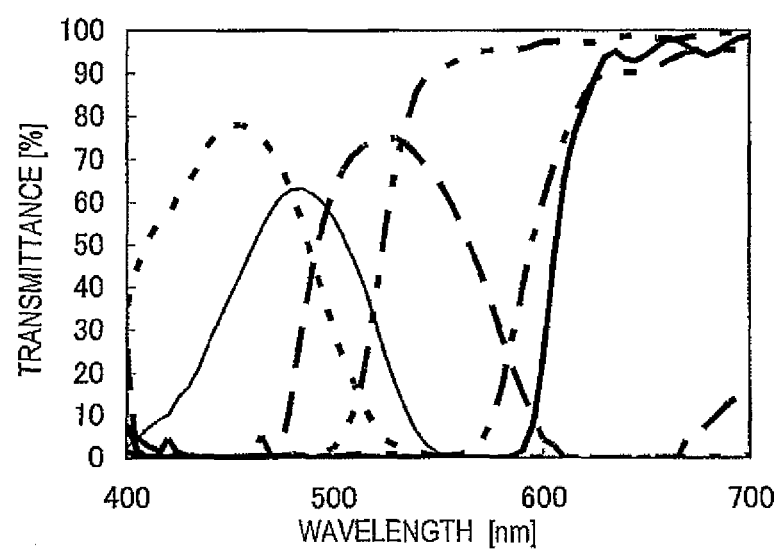
FIG. 11 is a graph showing spectral transmittance characteristics of a color filter corresponding to Example 1.
Figure 12:
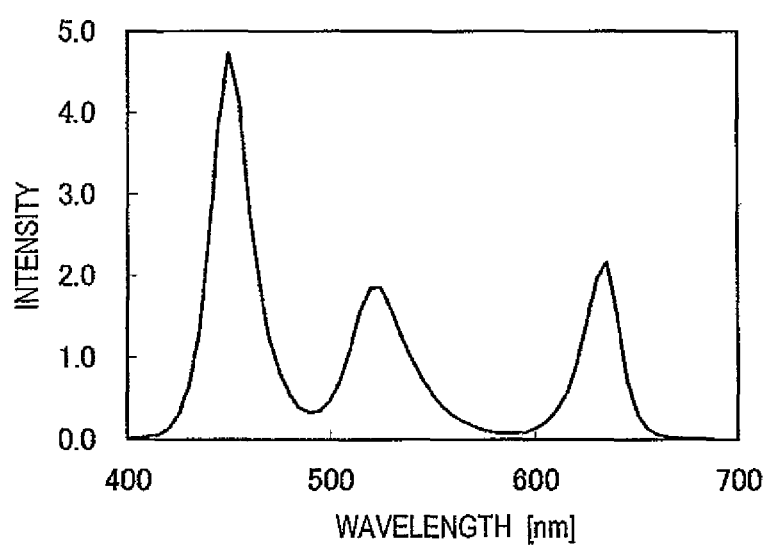
FIG. 12 is a graph showing a backlight spectrum corresponding to Example 1.

Table 7 shows the Y value, xy chromaticity, dominant wavelength, color purity, and display quality of each subpixel in this Example. Table 8 shows the Y value, xy chromaticity, dominant wavelength (or complementary wavelength for magenta), color purity, and display quality of each primary color in this Example. Moreover, spectral transmittance characteristics of color filters and a backlight spectrum in this Example are shown in FIG. 11 and FIG. 12.

As seen from Table 7, the Y value, dominant wavelength, and color purity of each subpixel are generally within the preferable value ranges as shown in Table 6. Therefore, as seen from Table 8, the Y value, dominant wavelength, and color purity of each primary color are generally within the preferable value ranges as shown in Table 5. As a result, a very good display quality was obtained with respect to all primary colors.

TABLE 7

|  | W | R1 | R2 | Ye | G | C | B |
|---|---|---|---|---|---|---|---|
| Y [%] | 100 | 8.8 | 9.5 | 36.2 | 30.0 | 10.3 | 5.6 |
| x | 0.293 | 0.684 | 0.677 | 0.461 | 0.167 | 0.136 | 0.149 |
| y | 0.273 | 0.293 | 0.305 | 0.517 | 0.722 | 0.140 | 0.045 |
| DOMINANT WAVELENGTH [nm] | 9103* | 630 | 620 | 574 | 526 | 477 | 450 |
| COLOR PURITY [%] |  | 94 | 96 | 94 | 79 | 85 | 95 |
| DISPLAY QUALITY |  | X | X | X | ⊚ | ○ | ○ |

*COLOR TEMPERATURE (K)

TABLE 8

|  | W | R* | Ye* | G | C* | B | M* |
|---|---|---|---|---|---|---|---|
| Y [%] | 100 | 18.2 | 74.7 | 30.0 | 45.5 | 5.6 | 23.7 |
| x | 0.293 | 0.684 | 0.423 | 0.167 | 0.148 | 0.149 | 0.327 |
| y | 0.273 | 0.299 | 0.531 | 0.722 | 0.192 | 0.045 | 0.129 |
| DOMINANT WAVELENGTH [nm] |  | 625 | 596 | 526 | 481 | 450 | 555† |
| COLOR PURITY [%] |  | 96 | 87 | 79 | 75 | 95 | 79 |
| DISPLAY QUALITY |  | ⊚ | ⊚ | ⊚ | ⊚ | ⊚ | ⊚ |

*R = R1 + R2
*Ye = R1 + R2 + Ye + G
*C = G + C + B
*M = R1 + R2 + B
†COMPLEMENTARY WAVELENGTH (nm)

EXAMPLE 2

Figure 13:
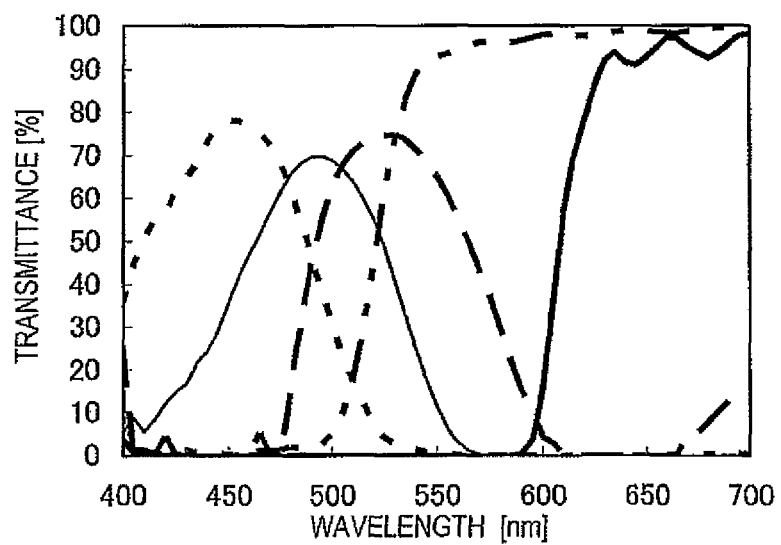
FIG. 13 is a graph showing spectral transmittance characteristics of a color filter corresponding to Example 2.
Figure 14:
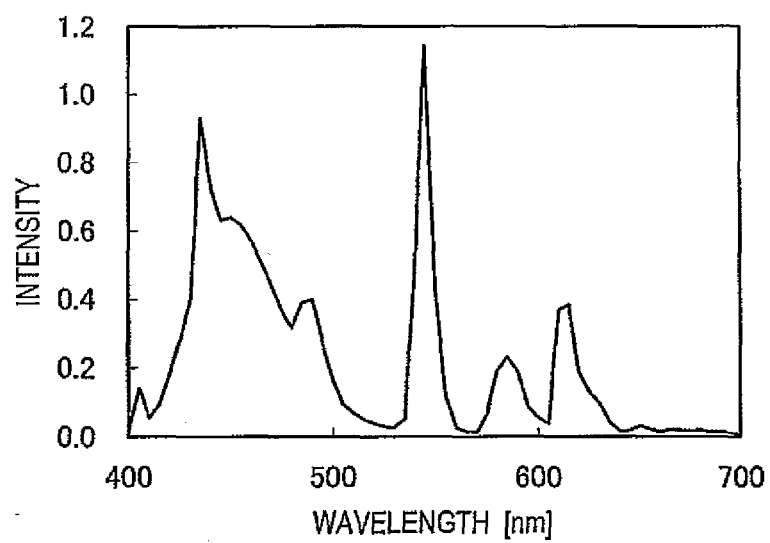
FIG. 14 is a graph showing a backlight spectrum corresponding to Example 2.

Table 9 shows the Y value and the like of each subpixel in this Example, and Table 10 shows the Y value and the like of each primary color in this Example. Moreover, spectral transmittance characteristics of color filters and a backlight spectrum in this Example are shown in FIG. 13 and FIG. 14.

As seen from Table 9, the Y value, dominant wavelength, and color purity of each subpixel are generally within the preferable value ranges as shown in Table 6. Therefore, as seen from Table 10, the Y value, dominant wavelength, and color purity of each primary color are generally within the preferable value ranges as shown in Table 5. As a result, a very good display quality was obtained with respect to red, green, yellow, and cyan; and a good display quality was obtained with respect to blue and magenta.

TABLE 9

|   | W | R1 | R1 | Ye | G | C | B |
|---|---|---|---|---|---|---|---|
| Y [%] | 100 | 5.3 | 5.3 | 46.0 | 27.2 | 11.6 | 5.1 |
| x | 0.284 | 0.673 | 0.673 | 0.441 | 0.251 | 0.143 | 0.146 |
| y | 0.294 | 0.315 | 0.315 | 0.538 | 0.625 | 0.165 | 0.047 |
| DOMINANT WAVELENGTH [nm] | 9306* | 617 | 617 | 570 | 537 | 478 | 463 |
| COLOR PURITY [%] |  | 97 | 97 | 93 | 67 | 79 | 96 |
| DISPLAY QUALITY |  | X | X | X | ◎ | ○ | ○ |

*COLOR TEMPERATURE (K)

TABLE 10

|   | W | R* | Ye* | G | C* | B | M* |
|---|---|---|---|---|---|---|---|
| Y [%] | 100 | 10.6 | 83.5 | 27.2 | 43.6 | 5.1 | 15.6 |
| x | 0.284 | 0.673 | 0.439 | 0.251 | 0.165 | 0.146 | 0.270 |
| y | 0.294 | 0.315 | 0.517 | 0.625 | 0.196 | 0.047 | 0.109 |
| DOMINANT WAVELENGTH [nm] |  | 617 | 572 | 537 | 480 | 463 | 569† |
| COLOR PURITY [%] |  | 97 | 88 | 67 | 69 | 96 | 78 |
| DISPLAY QUALITY |  | ◎ | ◎ | ◎ | ◎ | ○ | ○ |

*R = R1 + R2
*Ye = R1 + R2 + Ye + G
*C = G + C + B
*M = R1 + R2 + B
†COMPLEMENTARY WAVELENGTH (nm)

EXAMPLE 3

Figure 15:
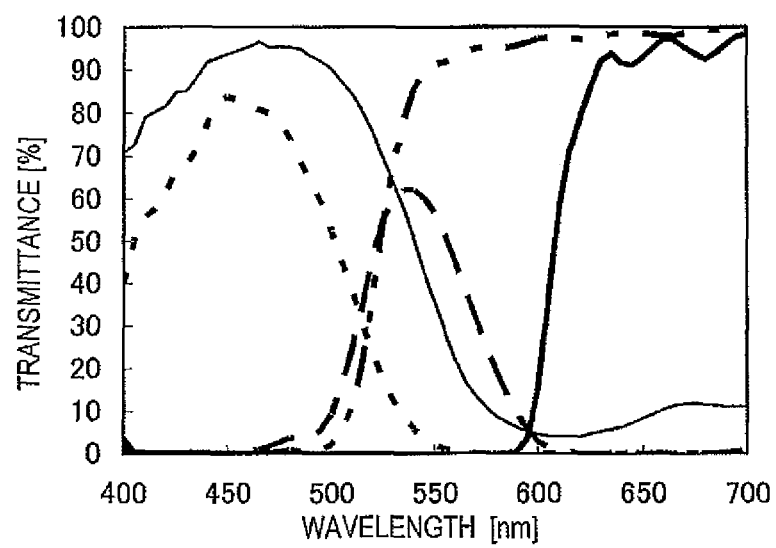
FIG. 15 is a graph showing spectral transmittance characteristics of a color filter corresponding to Example 3.
Figure 16:
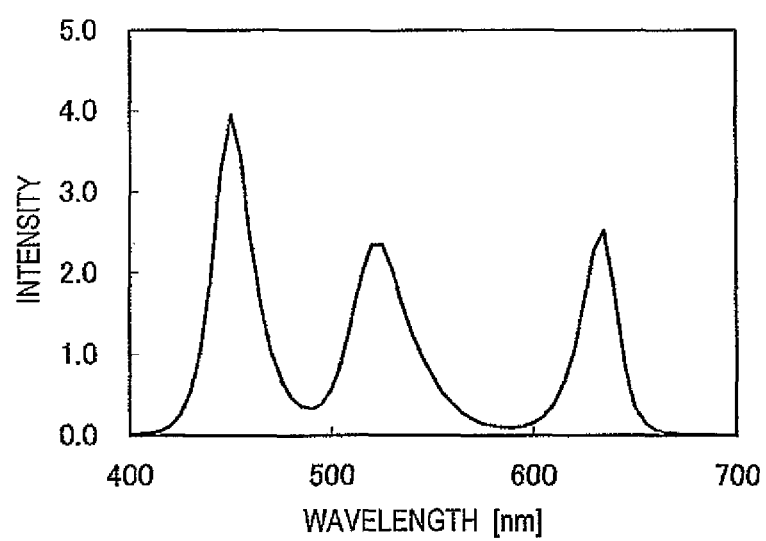
FIG. 16 is a graph showing a backlight spectrum corresponding to Example 3.

Table 11 shows the Y value and the like of each subpixel in this Example, and Table 12 shows the Y value and the like of each primary color in this Example. Moreover, spectral transmittance characteristics of color filters and a backlight spectrum in this Example are shown in FIG. 15 and FIG. 16.

As seen from Table 11, the Y value, dominant wavelength, and color purity of each subpixel are generally within the preferable value ranges as shown in Table 6. Therefore, as seen from Table 12, the Y value, dominant wavelength, and color purity of each primary color are generally within the preferable value ranges as shown in Table 5. As a result, a very good display quality was obtained with respect to red, yellow, cyan, and magenta; and a good display quality was obtained with respect to green and blue.

TABLE 11

|   | W | R1 | R1 | Ye | G | C | B |
|---|---|---|---|---|---|---|---|
| Y [%] | 100 | 7.1 | 7.1 | 32.5 | 19.3 | 26.3 | 8.3 |
| x | 0.283 | 0.697 | 0.697 | 0.452 | 0.191 | 0.153 | 0.144 |
| y | 0.293 | 0.296 | 0.296 | 0.526 | 0.739 | 0.216 | 0.096 |
| DOMINANT WAVELENGTH [nm] | 9454* | 627 | 627 | 572 | 532 | 482 | 471 |
| COLOR PURITY [%] |  | 98 | 98 | 94 | 88 | 71 | 89 |
| DISPLAY QUALITY |  | X | X | X | ○ | ◎ | ◎ |

*COLOR TEMPERATURE (K)

TABLE 12

|  | W | R* | Ye* | G | C* | B | M* |
|---|---|---|---|---|---|---|---|
| Y [%] | 100 | 14.2 | 65.7 | 19.3 | 53.6 | 8.3 | 22.3 |
| x | 0.283 | 0.697 | 0.490 | 0.191 | 0.153 | 0.144 | 0.342 |
| y | 0.293 | 0.296 | 0.487 | 0.739 | 0.230 | 0.096 | 0.167 |
| DOMINANT WAVELENGTH [nm] |  | 627 | 578 | 532 | 484 | 471 | 553† |
| COLOR PURITY [%] |  | 98 | 93 | 88 | 70 | 89 | 66 |
| DISPLAY QUALITY |  | ⊚ | ⊚ | ○ | ⊚ | ○ | ⊚ |

*R = R1 + R2
*Ye = R1 + R2 + Ye + G
*C = G + C + B
*M = R1 + R2 + B
†COMPLEMENTARY WAVELENGTH (nm)

EXAMPLE 4

Figure 17:
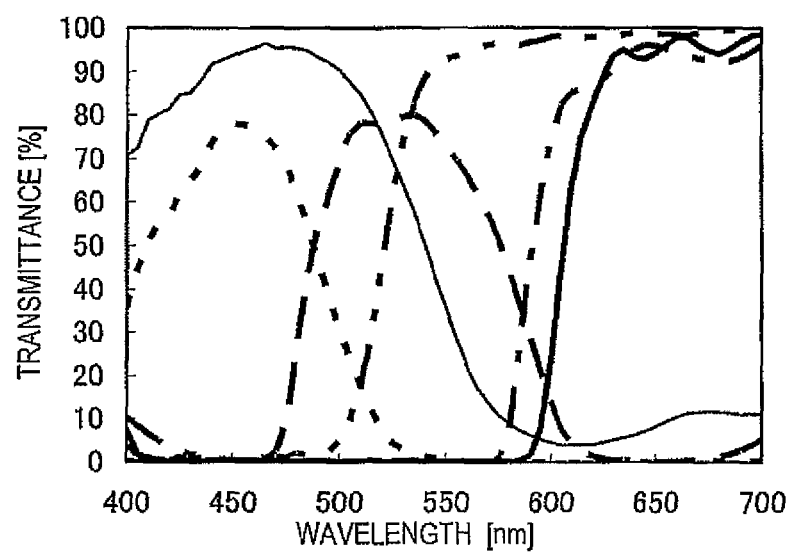
FIG. 17 is a graph showing spectral transmittance characteristics of a color filter corresponding to Example 4.
Figure 18:
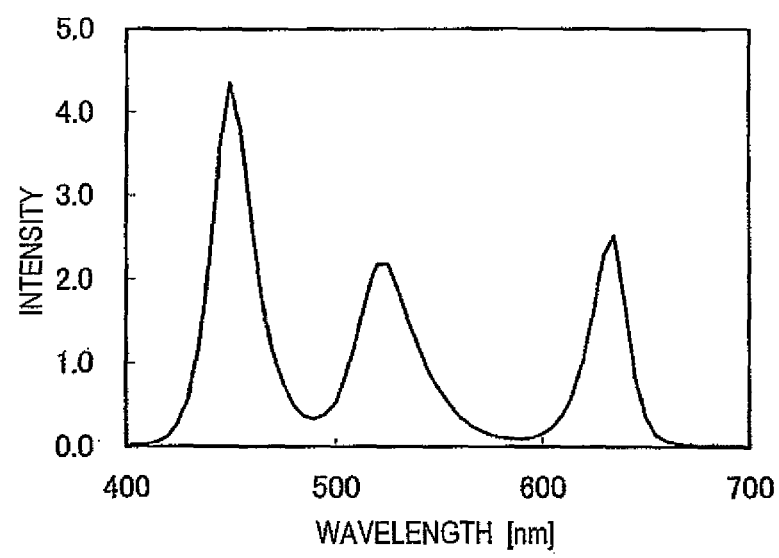
FIG. 18 is a graph showing a backlight spectrum corresponding to Example 4.

Table 13 shows the Y value and the like of each subpixel in this Example, and Table 14 shows the Y value and the like of each primary color in this Example. Moreover, spectral transmittance characteristics of color filters and a backlight spectrum in this Example are shown in FIG. 17 and FIG. 18.

As seen from Table 13, the Y value, dominant wavelength, and color purity of each subpixel are generally within the preferable value ranges as shown in Table 6. Therefore, as seen from Table 14, the Y value, dominant wavelength, and color purity of each primary color are generally within the preferable value ranges as shown in Table 5. As a result, a very good display quality was obtained with respect to red, green, yellow, cyan, and magenta; and a good display quality was obtained with respect to blue.

EXAMPLE 5

Figure 19:
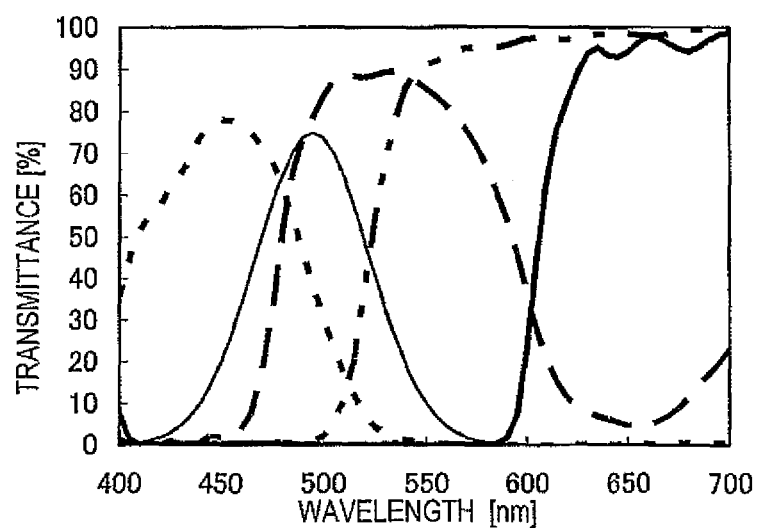
FIG. 19 is a graph showing spectral transmittance characteristics of a color filter corresponding to Example 5.
Figure 20:
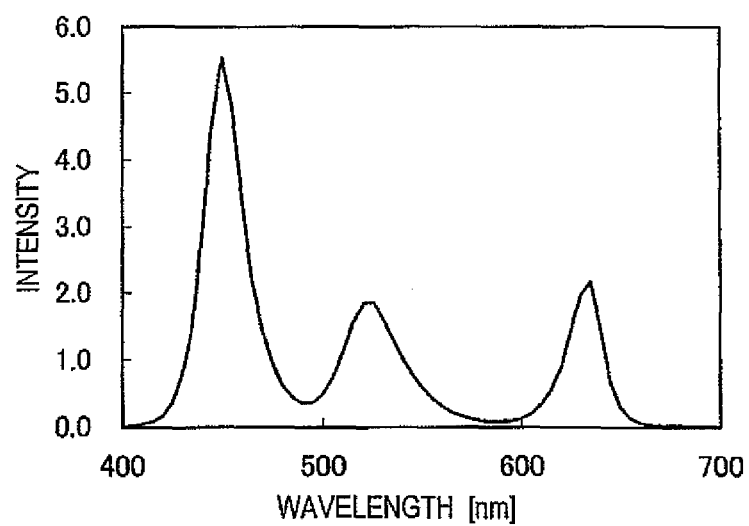
FIG. 20 is a graph showing a backlight spectrum corresponding to Example 5.

Table 15 shows the Y value and the like of each subpixel in this Example, and Table 16 shows the Y value and the like of each primary color in this Example. Moreover, spectral transmittance characteristics of color filters and a backlight spectrum in this Example are shown in FIG. 19 and FIG. 20.

As seen from Table 15, the Y value, dominant wavelength, and color purity of each subpixel are generally within the preferable value ranges as shown in Table 6. Therefore, as seen from Table 16, the Y value, dominant wavelength, and color purity of each primary color are generally within the preferable value ranges as shown in Table 5. As a result, a very good display quality was obtained with respect to red, blue, yellow, cyan, and magenta; and a good display quality was obtained with respect to green.

TABLE 13

|  | W | R1 | R2 | Ye | G | C | B |
|---|---|---|---|---|---|---|---|
| Y [%] | 100 | 7.1 | 7.8 | 31.3 | 26.7 | 23.3 | 4.0 |
| x | 0.284 | 0.685 | 0.678 | 0.444 | 0.178 | 0.153 | 0.148 |
| y | 0.294 | 0.295 | 0.298 | 0.525 | 0.717 | 0.192 | 0.051 |
| DOMINANT WAVELENGTH [nm] | 9855* | 625 | 625 | 572 | 527 | 481 | 463 |
| COLOR PURITY [%] |  | 96 | 94 | 91 | 79 | 74 | 95 |
| DISPLAY QUALITY |  | X | X | X | ⊚ | ○ | ○ |

*COLOR TEMPERATURE (K)

TABLE 14

|  | W | R* | Ye* | G | C* | B | M* |
|---|---|---|---|---|---|---|---|
| Y [%] | 100 | 14.8 | 64.9 | 26.7 | 53.7 | 4.0 | 18.6 |
| x | 0.284 | 0.685 | 0.411 | 0.178 | 0.155 | 0.148 | 0.357 |
| y | 0.294 | 0.296 | 0.540 | 0.717 | 0.228 | 0.051 | 0.146 |
| DOMINANT WAVELENGTH [nm] |  | 625 | 567 | 527 | 484 | 463 | 547† |
| COLOR PURITY [%] |  | 96 | 86 | 79 | 69 | 95 | 77 |
| DISPLAY QUALITY |  | ⊚ | ⊚ | ⊚ | ⊚ | ○ | ⊚ |

*R = R1 + R2
*Ye = R1 + R2 + Ye + G
*C = G + C + B
*M = R1 + R2 + B
†COMPLEMENTARY WAVELENGTH (nm)

TABLE 15

|  | W | R1 | R1 | Ye | G | C | B |
| --- | --- | --- | --- | --- | --- | --- | --- |
| Y [%] | 100 | 7.6 | 7.6 | 31.3 | 34.8 | 14.2 | 5.3 |
| x | 0.281 | 0.685 | 0.685 | 0.461 | 0.206 | 0.131 | 0.149 |
| y | 0.289 | 0.293 | 0.293 | 0.517 | 0.595 | 0.254 | 0.043 |
| DOMINANT WAVELENGTH [nm] | 9052* | 630 | 630 | 573 | 522 | 489 | 460 |
| COLOR PURITY [%] |  | 94 | 94 | 93 | 53 | 75 | 76 |
| DISPLAY QUALITY |  | X | X | X | ○ | ○ | ◎ |

*COLOR TEMPERATURE (K)

TABLE 16

|  | W | R* | Ye* | G | C* | B | M* |
| --- | --- | --- | --- | --- | --- | --- | --- |
| Y [%] | 100 | 15.1 | 80.9 | 34.8 | 53.9 | 5.3 | 20.2 |
| x | 0.281 | 0.685 | 0.442 | 0.206 | 0.158 | 0.149 | 0.308 |
| y | 0.289 | 0.293 | 0.477 | 0.595 | 0.229 | 0.043 | 0.117 |
| DOMINANT WAVELENGTH [nm] |  | 630 | 578 | 522 | 484 | 460 | 559† |
| COLOR PURITY [%] |  | 94 | 93 | 53 | 68 | 96 | 79 |
| DISPLAY QUALITY |  | ◎ | ◎ | ○ | ◎ | ◎ | ◎ |

*R = R1 + R2
*Ye = R1 + R2 + Ye + G
*C = G + C + B
*M = R1 + R2 + B
†COMPLEMENTARY WAVELENGTH (nm)

EXAMPLE 6

Figure 21:
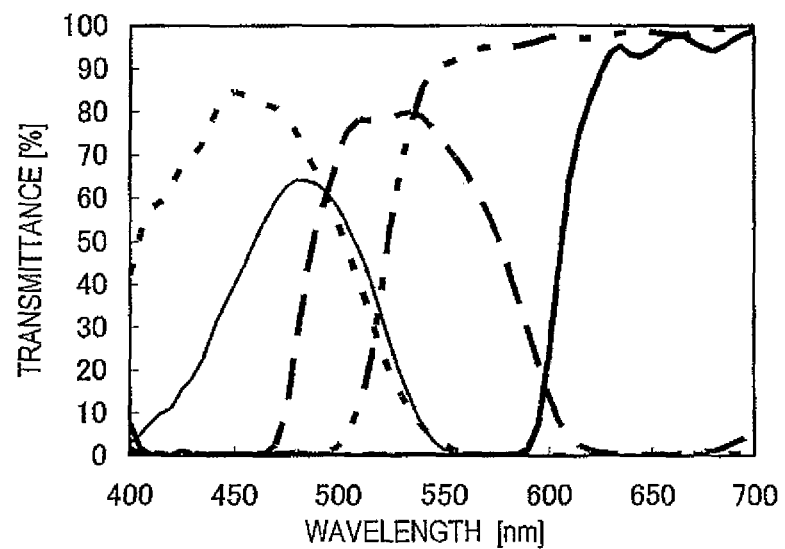
FIG. 21 is a graph showing spectral transmittance characteristics of a color filter corresponding to Example 6.
Figure 22:
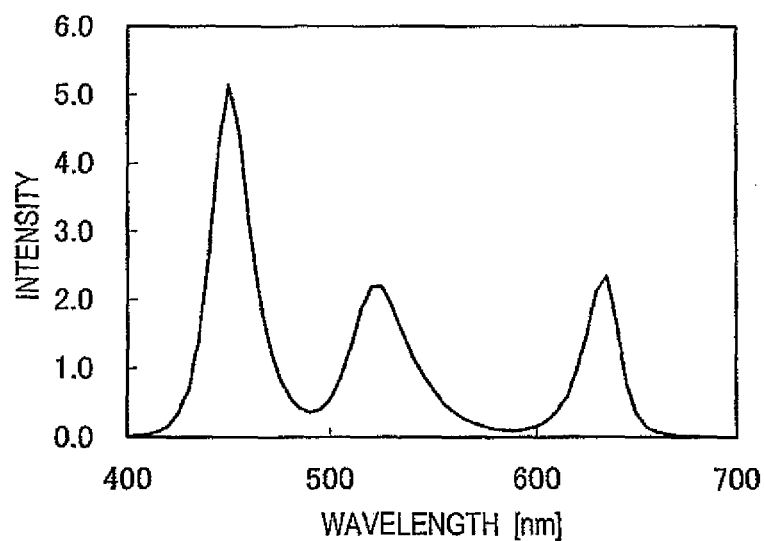
FIG. 22 is a graph showing a backlight spectrum corresponding to Example 6.

Table 17 shows the Y value and the like of each subpixel in this Example, and Table 18 shows the Y value and the like of each primary color in this Example. Moreover, spectral transmittance characteristics of color filters and a backlight spectrum in this Example are shown in FIG. 21 and FIG. 22.

As seen from Table 17, the Y value, dominant wavelength, and color purity of each subpixel are generally within the preferable value ranges as shown in Table 6. Therefore, as seen from Table 18, the Y value, dominant wavelength, and color purity of each primary color are generally within the preferable value ranges as shown in Table 5. As a result, a very good display quality was obtained with respect to red, green, yellow, and magenta; and a good display quality was obtained with respect to blue and cyan.

TABLE 17

|  | W | R1 | R1 | Ye | G | C | B |
| --- | --- | --- | --- | --- | --- | --- | --- |
| Y [%] | 100 | 7.7 | 7.7 | 33.6 | 31.2 | 10.4 | 10.0 |
| x | 0.284 | 0.687 | 0.687 | 0.451 | 0.176 | 0.137 | 0.146 |
| Y | 0.286 | 0.295 | 0.295 | 0.526 | 0.714 | 0.150 | 0.082 |
| DOMINANT WAVELENGTH [nm] | 9671* | 625 | 625 | 572 | 527 | 478 | 469 |
| COLOR PURITY [%] |  | 96 | 96 | 93 | 78 | 84 | 90 |
| DISPLAY QUALITY |  | X | X | X | ◎ | ○ | ○ |

*COLOR TEMPERATURE (K)

TABLE 18

|  | W | R* | Ye* | G | C* | B | M* |
| --- | --- | --- | --- | --- | --- | --- | --- |
| Y [%] | 100 | 15.3 | 79.9 | 31.2 | 51.4 | 10.0 | 25.2 |
| x | 0.286 | 0.687 | 0.454 | 0.176 | 0.148 | 0.146 | 0.308 |
| y | 0.287 | 0.294 | 0.503 | 0.714 | 0.219 | 0.082 | 0.145 |
| DOMINANT WAVELENGTH [nm] |  | 620 | 578 | 527 | 483 | 469 | 560† |
| COLOR PURITY [%] |  | 96 | 89 | 78 | 72 | 90 | 69 |
| DISPLAY QUALITY |  | ◎ | ◎ | ◎ | ○ | ○ | ◎ |

*R = R1 + R2
*Ye = R1 + R2 + Ye + G
*C = G + C + B
*M = R1 + R2 + B
†COMPLEMENTARY WAVELENGTH (nm)

EXAMPLE 7

Figure 23:
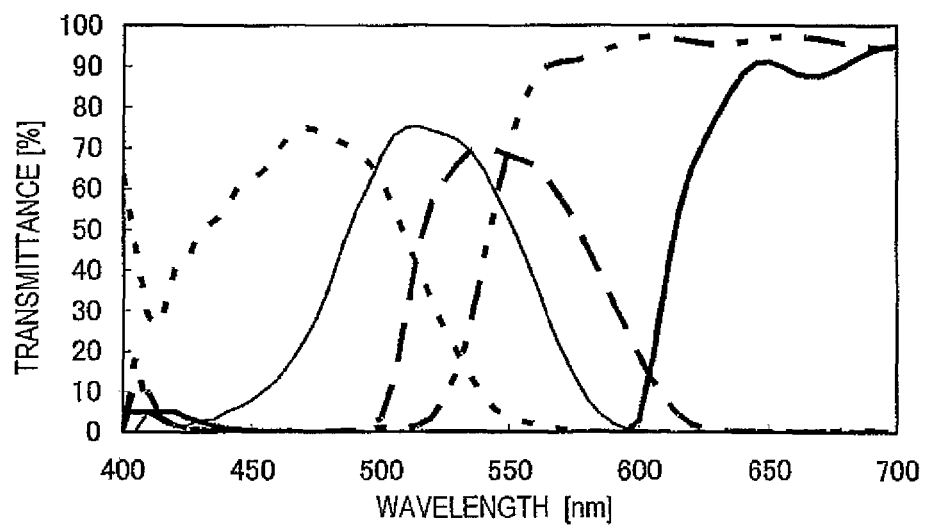
FIG. 23 is a graph showing spectral transmittance characteristics of a color filter corresponding to Example 7.
Figure 24:
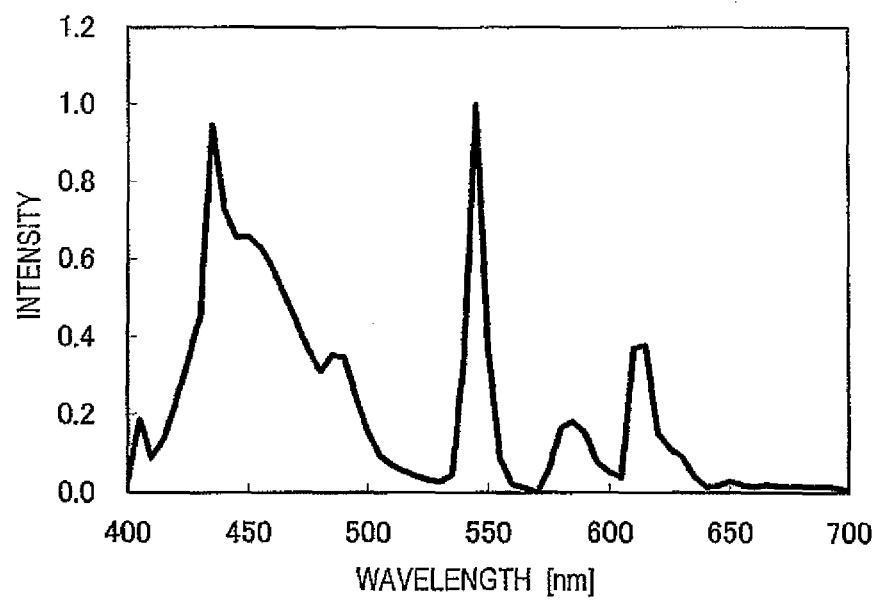
FIG. 24 is a graph showing a backlight spectrum corresponding to Example 7.

Table 19 shows the Y value and the like of each subpixel in this Example, and Table 20 shows the Y value and the like of each primary color in this Example. Moreover, spectral transmittance characteristics of color filters and a backlight spectrum in this Example are shown in FIG. 23 and FIG. 24.

As seen from Table 19, the Y value, dominant wavelength, and color purity of each subpixel are generally within the preferable value ranges as shown in Table 6. Therefore, as seen from Table 20, the Y value, dominant wavelength, and color purity of each primary color are generally within the preferable value ranges as shown in Table 5. As a result, a very good display quality was obtained with respect to green, yellow, blue, cyan and magenta; and a good display quality was obtained with respect to red.

TABLE 19

|  | W | R1 | R1 | Ye | G | C | B |
|---|---|---|---|---|---|---|---|
| Y [%] | 100 | 8.2 | 8.2 | 42.2 | 22.1 | 14.6 | 5.5 |
| x |  | 0.299 | 0.655 | 0.655 | 0.449 | 0.246 | 0.146 | 0.147 |
| y |  | 0.294 | 0.337 | 0.334 | 0.535 | 0.651 | 0.225 | 0.047 |
| DOMINANT WAVELENGTH [nm] | 7953* | 609 | 610 | 572 | 538 | 483 | 462 |
| COLOR PURITY [%] |  | 97 | 97 | 96 | 73 | 71 | 97 |
| DISPLAY QUALITY |  | X | X | X | ◉ | ◉ | ◉ |

*COLOR TEMPERATURE (K)

TABLE 20

|  | W | R* | Ye* | G | C* | B | M* |
|---|---|---|---|---|---|---|---|
| Y [%] | 100 | 16.5 | 80.3 | 22.1 | 41.7 | 5.3 | 21.7 |
| x | 0.299 | 0.655 | 0.471 | 0.246 | 0.161 | 0.146 | 0.298 |
| y | 0.294 | 0.337 | 0.500 | 0.651 | 0.195 | 0.047 | 0.132 |
| DOMINANT WAVELENGTH [nm] |  | 609 | 576 | 538 | 480 | 462 | 560† |
| COLOR PURITY [%] |  | 88 | 91 | 73 | 70 | 96 | 73 |
| DISPLAY QUALITY |  | ○ | ◉ | ◉ | ◉ | ◉ | ◉ |

*R = R1 + R2

*Ye = R1 + R2 + Ye + G

*C = G + C + B

*M = R1 + R2 + B

†COMPLEMENTARY WAVELENGTH

EXAMPLE 8

Figure 25:
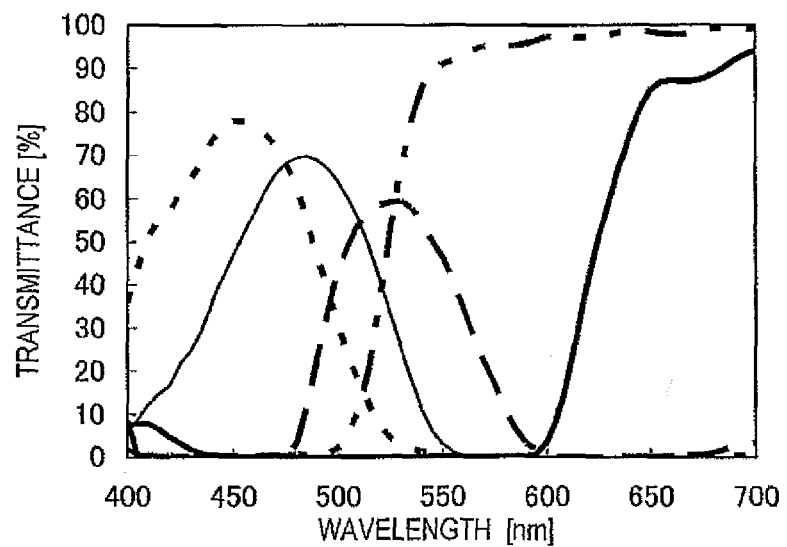
FIG. 25 is a graph showing spectral transmittance characteristics of a color filter corresponding to Example 8.
Figure 26:
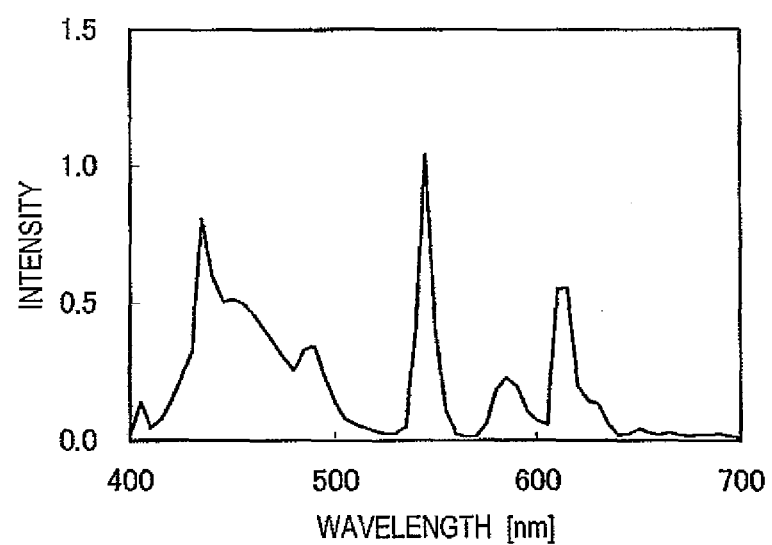
FIG. 26 is a graph showing a backlight spectrum corresponding to Example 8.

Table 21 shows the Y value and the like of each subpixel in this Example, and Table 22 shows the Y value and the like of each primary color in this Example. Moreover, spectral transmittance characteristics of color filters and a backlight spectrum in this Example are shown in FIG. 25 and FIG. 26.

As seen from Table 21, since the first and second red subpixels R1 and R2 had a slightly low Y value of about 4%, which is not within the preferable value range shown in Table 6 (i.e., no less than about 5% and no more than about 11%), the Y value of red was not sufficiently raised. As a result, as seen from Table 22, the Y value of red was slightly low, i.e., about 7.9%, which is not within the preferable value range shown in Table 5 (i.e., no less than about 10% and no more than about 22%). This makes the displayed red slightly darker than is attained in Examples 1 to 7. Moreover, since the first and second red subpixels R1 and R2 had a slightly low Y value, the Y value of magenta was not sufficiently raised. As a result, as seen from Table 22, the Y value of magenta was slightly low, i.e., about 13.1%, which is not within the preferable value range (i.e., no less than about 15% and no more than about 30%) shown in Table 5. This makes the displayed magenta slightly darker than is attained in Examples 1 to 7.

TABLE 21

|  | W | R1 | R1 | Ye | G | C | B |
|---|---|---|---|---|---|---|---|
| Y [%] | 100 | 4.0 | 4.0 | 57.0 | 21.5 | 8.6 | 5.3 |
| x | 0.284 | 0.656 | 0.656 | 0.479 | 0.246 | 0.137 | 0.146 |
| y | 0.286 | 0.299 | 0.299 | 0.513 | 0.668 | 0.107 | 0.047 |
| DOMINANT WAVELENGTH [nm] | 9335* | 625 | 625 | 575 | 540 | 473 | 462 |
| COLOR PURITY [%] |  | 88 | 88 | 98 | 80 | 89 | 86 |
| DISPLAY QUALITY |  | X | X | X | ○ | X | ◎ |

*COLOR TEMPERATURE (K)

TABLE 22

|  | W | R* | Ye* | G | C* | B | M* |
|---|---|---|---|---|---|---|---|
| Y [%] | 100 | 7.9 | 86.2 | 21.5 | 35.2 | 5.3 | 13.1 |
| x | 0.286 | 0.656 | 0.463 | 0.246 | 0.157 | 0.146 | 0.242 |
| y | 0.287 | 0.299 | 0.510 | 0.668 | 0.156 | 0.047 | 0.094 |
| DOMINANT WAVELENGTH [nm] |  | 625 | 574 | 540 | 477 | 462 | 567† |
| COLOR PURITY [%] |  | 88 | 92 | 80 | 77 | 96 | 78 |
| DISPLAY QUALITY |  | Δ | ◎ | ◎ | ◎ | ◎ | Δ |

*R = R1 + R2
*Ye = R1 + R2 + Ye + G
*C = G + C + B
*M = R1 + R2 + B
†COMPLEMENTARY WAVELENGTH (nm)

Next, preferable examples of subpixel arrangement within a pixel will be described.

Firstly, FIGS. 27A to 27L show examples of preferable arrangement of the blue subpixel B and yellow subpixel Ye. In FIGS. 27A to 27L, subpixels other than the blue subpixel B and yellow subpixel Ye do not need to be distinguishable, and therefore are simply denoted as X1, X2, X3, and X4. Thus, in FIGS. 27A to 27L and the subsequent figures, subpixels other than the subpixels of interest will be denoted as X1, X2, and so on.

As shown in FIGS. 27A to 27L, it is preferable that the blue subpixel B and the yellow subpixel Ye are contiguously arranged. The reasons thereof will be described below.

In the case where one pixel is composed of a red subpixel, a green subpixel, and a blue subpixel, as in a conventional display device which uses three primaries for displaying, mixing of color light from the three subpixels easily occurs. However, in the case where one pixel is composed of even more subpixels, as in a multi-primary display device, color light from the respective subpixels may be difficult to mix depending on the arrangement of subpixels, and there may be problems in visual recognition. In particular, it may not be possible to attain uniform display when displaying white.

Although all subpixels are at their maximum luminance when displaying white, there are large differences in hue and lightness between the respective subpixels. The degree to which the color light from one subpixel is mixed with the color light from an adjoining subpixel is determined by the hue and lightness of each subpixel. Therefore, without considering such characteristics of the subpixels, uniform white displaying cannot be attained; for example, dark lines and bright lines may be observed, or tinted lines may be observed.

Among the plurality of subpixels composing the pixels of a multi-primary display device, the yellow subpixel Ye has a very high lightness and thus is likely to be a cause for bright lines. As shown in FIGS. 27A to 27L, when the blue subpixel B and the yellow subpixel Ye are contiguously arranged, the yellow subpixel Ye having a very high lightness and the blue subpixel B having the lowest lightness adjoin each other, so that bright lines are unlikely to be observed. Moreover, since the yellow subpixel Ye and the blue subpixel B are complementary colors to each other, the region where the yellow subpixel Ye and the blue subpixel B are contiguously arranged becomes a region displaying good white, with little tinting. Thus, by disposing the blue subpixel B and the yellow subpixel Ye so as to be contiguous, the lightness and hue can be well averaged out, thus facilitating uniform white displaying.

Figure 28A:
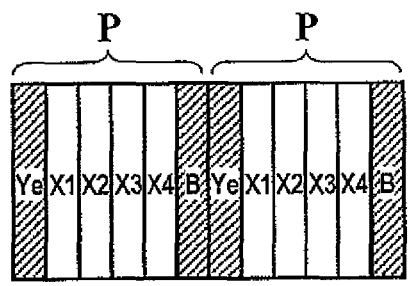
FIGS. 28A and 28B are diagrams showing preferable examples of subpixel arrangement.
Figure 28B:
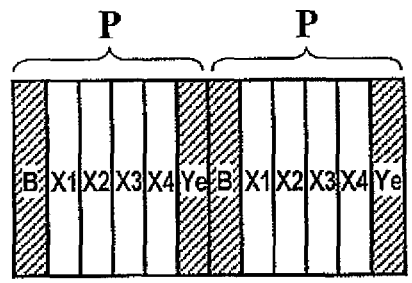

In the exemplary arrangements shown in FIGS. 27A to 27E and 27G to 27K, the blue subpixel B is contiguous with the yellow subpixel Ye within the same pixel; on the other hand, in the exemplary arrangements shown in FIGS. 27F and 27L, the blue subpixel B is contiguous with the yellow subpixel Ye in an adjoining pixel. FIGS. 28A and 28B show two pixels P adjoining along the row direction when the exemplary arrangements shown in FIGS. 27F and 27L are adopted. As shown in FIGS. 28A and 28B, the blue subpixel B is not contiguous with the yellow subpixel Ye within the same pixel, but is contiguous with the yellow subpixel Ye in an adjoining pixel.

Thus, the blue subpixel B and the yellow subpixel Ye may be contiguous within the same pixel as shown in FIGS. 27A to 27E and 27G to 27K, or may be contiguous across two adjoining pixels as shown in FIGS. 27F and 27L or FIGS. 28A and 28B. In the present specification, it is said that "subpixels (two or more subpixels) are contiguously arranged" in both of the case where the subpixels are contiguous within the same pixel and the case where the subpixels are contiguous across two adjoining pixels. This similarly applies to the preferable arrangements described below.

In the case where the blue subpixel B and the yellow subpixel Ye are contiguously arranged, it is furthermore preferable that the first red subpixel R1 or the second red subpixel R2 adjoins the yellow subpixel Ye. Specifically, as shown in FIGS. 29A to 29L, it is preferable that the blue subpixel B, the yellow subpixel Ye, and the first or second red subpixel R are contiguous in this order (in this order from left to right in FIGS. 29A to 29F, and in this order from right to left in FIGS. 29G to 29L). In FIGS. 29A to 29L, since it is not necessary to distinguish between the first red subpixel R1 and the second red subpixel R2, they are simply denoted as "R". In FIGS. 29A to 29L, any subpixel that is denoted as "R" may be either the first red subpixel R1 or the second red subpixel R2. This similarly applies to the subsequent figures.

In the exemplary arrangements shown in FIGS. 29A to 29L, the blue subpixel having the lowest lightness adjoins the yellow subpixel Ye, and the first or second red subpixel R having a relatively low lightness also adjoins the yellow subpixel Ye. In other words, the blue subpixel B and the first or second red subpixel R are disposed on both sides of the yellow subpixel Ye. As a result, bright lines are less likely to be observed.

As has also been described with respect to the arrangement of the blue subpixel B and the yellow subpixel Ye, it will be appreciated that the blue subpixel B, the yellow subpixel Ye, and the first or second red subpixel R may be contiguous within the same pixel as shown in FIGS. 29A to 29D and 29H to 29E, or contiguous across two adjoining pixels as shown in FIGS. 29E to 29G and 29L.

Moreover, since the blue subpixel B has a low lightness and the color light from the blue subpixel B is easy to mix with the color light from any other subpixel, a dark line is likely to be observed when a subpixel having a low lightness is disposed next to the blue subpixel B. Therefore, it is preferable that the green subpixel G or the cyan subpixel C having a relatively high lightness is disposed next to the blue subpixel B.

In other words, it is preferable that: as shown in FIGS. 30A to 30L, the green subpixel G, the blue subpixel B, the yellow subpixel Ye, and the first or second red subpixel R are contiguously arranged in this order; or, as shown in FIGS. 31A to 31L, the cyan subpixel C, the blue subpixel B, the yellow subpixel Ye, and the first or second red subpixel R are contiguously arranged in this order. With such an arrangement, it is possible to perform display in a manner that dark lines are unlikely to be observed.

Note that the green subpixel G, the blue subpixel B, the yellow subpixel Ye, and the first or second red subpixel R may be contiguous within the same pixel as shown in FIGS. 30B to 30D and 30H to 30J, or contiguous across two adjoining pixels as shown in FIGS. 30A, 30E to 30G, 30K, and 30L. Moreover, the cyan subpixel C, the blue subpixel B, the yellow subpixel Ye, and the first or second red subpixel R may be contiguous within the same pixel as shown in FIGS. 31B to 31D and 31H to 31J, or contiguous across two adjoining pixels as shown in FIGS. 31A, 31E to 31G, 31K, and 31L.

As shown in FIGS. 30A to 30L, when the green subpixel G, the blue subpixel B, the yellow subpixel Ye, and the first or second red subpixel R are contiguously arranged in this order, the other two subpixels may be disposed in any order. Specifically, as shown in FIGS. 32A to 32L, one of the first and second red subpixels R, the green subpixel G, the blue subpixel B, the yellow subpixel Ye, and the other of the first and second red subpixels R, and the cyan subpixel C may be contiguously arranged in this order, or as shown in FIGS. 33A to 33L, the cyan subpixel C, the green subpixel G, the blue subpixel B, the yellow subpixel Ye, one of the first and second red subpixels R, and the other of the first and second red subpixels R may be contiguously arranged in this order.

As shown in FIGS. 31A to 31L, also when the cyan subpixel C, the blue subpixel B, the yellow subpixel Ye, and the first or second red subpixel R are contiguously arranged in this order, the other two subpixels may be disposed in any order. Specifically, as shown in FIGS. 34A to 34L, one of the first and second red subpixels R, the cyan subpixel C, the blue subpixel B, the yellow subpixel Ye, the other of the first and second red subpixels R, and the green subpixel G may be contiguously arranged in this order, or as shown in FIGS. 35A to 35L, the green subpixel G, the cyan subpixel C, the blue subpixel B, the yellow subpixel Ye, one of the first and second red subpixels R, and the other of the first and second red subpixels R may be contiguously arranged in this order.

With reference to FIGS. 30A to 30L and FIGS. 31A to 31L, it has already been described that the green subpixel G or the cyan subpixel C having a relatively high lightness is preferably disposed next to the blue subpixel B. For example, when the first or second red subpixel R having a relatively low lightness is disposed next to the blue subpixel B, a dark line which is tinted in magenta may be observed due to mixing of the color light from the blue subpixel B and the color light from the adjoining first or second red subpixel R. However, the dark line in this case can be made less likely to be observed by further disposing the green subpixel G next to the first or second red subpixel R adjoining the blue subpixel B.

That is, as shown in FIGS. 36A to 36L, the green subpixel G, one of the first and second red subpixels R, the blue subpixel B, the yellow subpixel Ye, and the other of the first and second red subpixels R may be contiguously arranged in this order, whereby occurrence of a dark line which is tinted in magenta can be alleviated to a non-problematic level because the green subpixel G having a relatively high lightness and displaying green which is a complementary color to magenta is disposed next to the first or second red subpixel R adjoining the blue subpixel B. Moreover, when the first and second red subpixels R are disposed at an equal interval as shown in FIGS. 36A to 36L, an effect of enhancing the uniformity of red displaying (reducing the perception of vertical stripes) can be obtained.

Moreover, when text characters and graphics are displayed, depending on the arrangement of subpixels, tinting of the pattern edge may occur. In order to reduce occurrence of tinting of the pattern edge, it is preferable that at least one of both ends of the pixel is neither the yellow subpixel Ye having a very high lightness nor the blue subpixel B having the lowest lightness (i.e., it is the first or second red subpixel R, the green subpixel G, or the cyan subpixel). In other words, as shown in FIGS. 32A to 32E and 32G to 32K, FIGS. 33A to 33E and 33G to 33K, FIGS. 34A to 34E and 34G to 34K, FIGS. 35A to 35E and 35G to 35K, FIGS. 36A to 36E and 36G to 36K, it is preferable that, in each of the plurality of pixels, at least one of the blue subpixel B and the yellow subpixel Ye is interposed between other subpixels (so as not to be located at an end of the pixel).

Moreover, in order to reduce occurrence of tinting of the pattern edge with a greater certainty, it is more preferable that neither end of the pixel is the yellow subpixel Ye or the blue subpixel B, and it is furthermore preferable that the yellow subpixel Ye and the blue subpixel B are located near the center of the pixel. In other words, as shown in (b) to (d) and (h) to (j) FIGS. 32B to 32D and 32H to 32J, FIGS. 33B to 33D and 33H to 33J, FIGS. 34B to 34D and 34H to 34J, FIGS. 35B to 35D and 35H to 35J, FIGS. 36B to 36D and 36H to 36J, it is more preferable that, in each of the plurality of pixels, the blue subpixel B and the yellow subpixel Ye are contiguously arranged and that the blue subpixel B and the yellow subpixel Ye being contiguously arranged are interposed between other subpixels (so as not to be located at an end of the pixel), and it is furthermore preferable that, as shown in FIGS. 32C and 32I, FIGS. 33C and 33I, FIGS. 34C and 34I, FIGS. 35C and 35I, FIGS. 36C and 36I, the blue subpixel B and the yellow subpixel Ye being contiguously arranged are located near the center of the pixel (herein, they are located at the third column and the fourth column in a pixel having subpixels disposed in 1 row by 6 columns).

The above discussion of preferable arrangements of subpixels has been made from the perspective of performing uniform white display. Now, preferable arrangements of subpixels will be described from different perspectives.

Figure 37A:
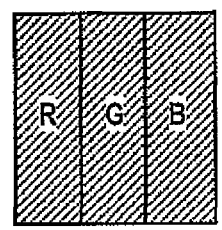
FIG. 37A is a diagram showing one pixel of a conventional display device which uses three primaries for displaying.
Figure 37B:
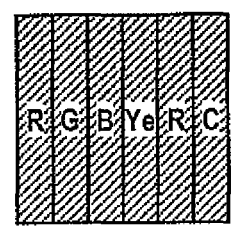
FIG. 37B is a diagram showing one pixel of a multi-primary display device.

As has already been described, when the number of primary colors used for displaying is increased, the number of subpixels per pixel is increased, so that the size of each subpixel decreases. For example, when a pixel of a three-primary display device, which includes three subpixels disposed in 1 row by 3 columns as shown in FIG. 37A, is replaced by a pixel of a multi-primary display device which is composed of six subpixels disposed in 1 row by 6 columns as shown in FIG. 37B (this replacement being made while conserving the pixel size), the width of each subpixel along the row direction (the right-left direction in the figure) becomes half. Depending on the arrangement of subpixels, this results in a problem in that, when a single-colored line extending along the column direction is displayed, the line width is halved. Hereinafter, this problem will be described more specifically.

Figure 38B:
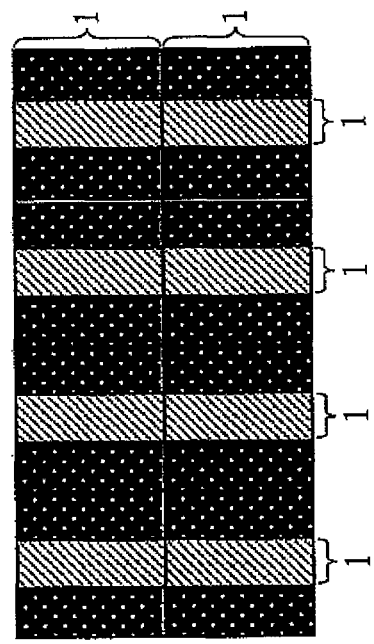
FIGS. 38A and 38B are diagrams for explaining the line width when a green line is displayed on a conventional display device which uses three primaries for displaying.
Figure 38A:
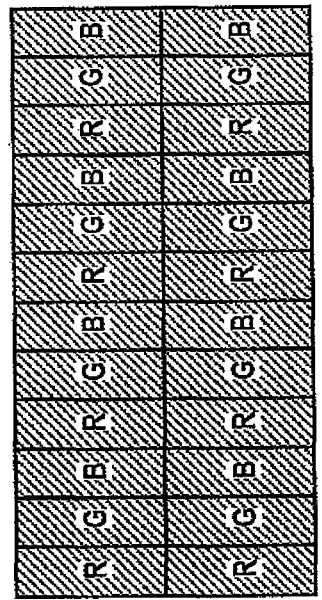

First, suppose the pixels of a three-primary display device shown in FIG. 37A are placed in a matrix arrangement as shown in FIG. 38A. In this case, if a green line is displayed by setting the green subpixel G to the highest luminance and setting the other subpixels to the lowest luminance, as shown in FIG. 38B, its line width is one subpixel with respect to both the row direction and the column direction.

Figure 39C:
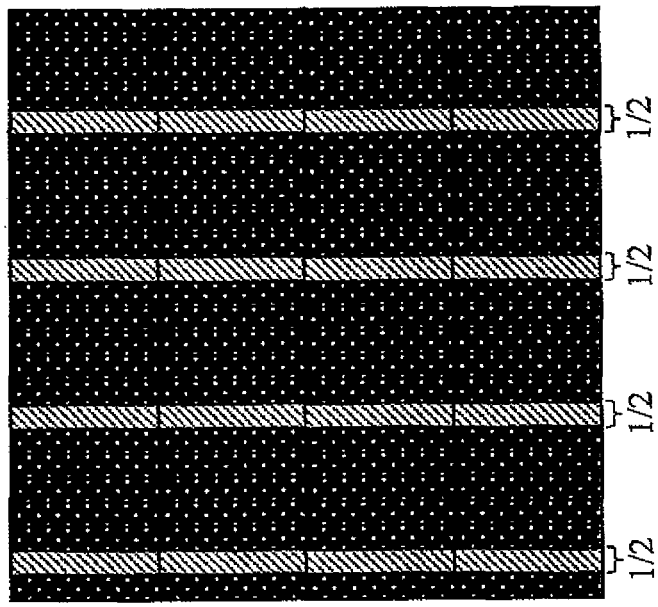
FIGS. 39A to 39C are diagrams for explaining reasons why a decrease in line width occurs in a multi-primary display device.
Figure 39B:
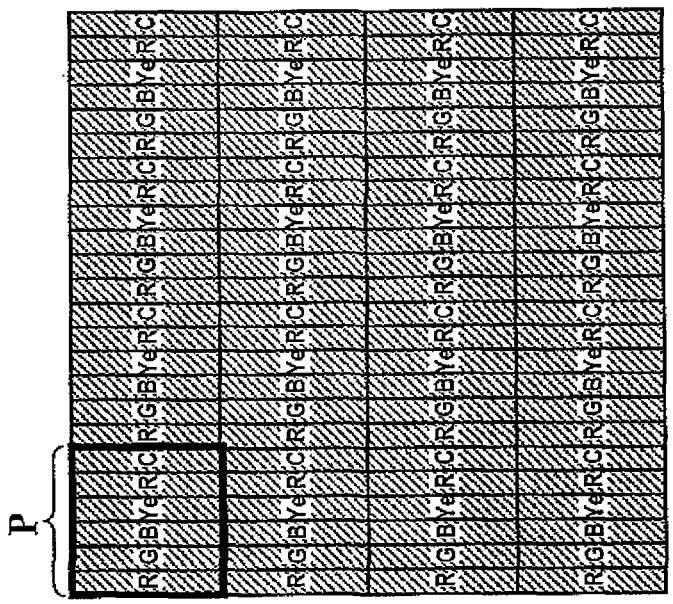
Figure 39A:
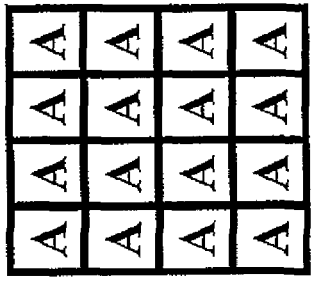

Assuming that the subpixels shown in FIG. 32C have an arrangement called pattern A, if the pixels P having this pattern A are simply placed in a matrix arrangement as shown in FIG. 39A, an arrangement shown in FIG. 39B will be obtained. If a green line is displayed in this arrangement by setting the green subpixel G to the highest luminance and the other subpixels to the lowest luminance, as shown in FIG. 39C, the width of a green line extending along the column direction will be ½ of that shown in FIG. 38B (i.e., a width corresponding to a half of a subpixel of the three-primary display device).

In order to prevent such a decrease in line width, it is preferable that two pixels adjoining along the column direction differ in their arrangements of plural subpixels. For example, assuming that the subpixels shown in FIG. 32B have an arrangement called pattern B, if the pixels P having pattern A and the pixels P' having pattern B are alternately disposed along the column direction as shown in FIG. 40A (i.e., the pixels P of pattern A are disposed in the odd-numbered rows and the pixels P' of pattern B are disposed in the even-numbered rows), an arrangement shown in FIG. 40B will be obtained.

The subpixel arrangement within the pixel is shifted by one column between the pixels P of pattern A and the pixels P' of pattern B. Therefore, in the arrangement shown in FIG. 40B, any subpixel displaying the same color belongs to different columns between two pixels P, P' adjoining along the column direction. For example, the green subpixel G belongs to the second column in the pixel P, but belongs to the first column in the pixel P'. Therefore, if a green line is displayed by setting the green subpixel G to the highest luminance and the other subpixels to the lowest luminance in this arrangement, as shown in FIG. 40C, the width of a green line extending along the column direction will be the same as that shown in FIG. 38B (i.e., the width of one subpixel of the three-primary display device).

In order to prevent a decrease in line width with a greater certainty, it is most preferable that subpixels of all colors belong to different columns between two pixels adjoining along the column direction. However, sufficient effects will be obtained so long as at least one of the green subpixel G and the yellow subpixel Ye having a high lightness belong to different columns, and even more sufficient effects will be obtained if both the green subpixel G and the yellow subpixel Ye belong to different columns.

Although the above discussion has been directed to an example where a plurality of subpixels are disposed in one row by multiple columns within a single pixel (stripe arrangement), the aforementioned problem of decreased line width can also occur in the case where a plurality of subpixels are disposed in multiple rows by multiple columns within a single pixel (mosaic arrangement).

Figure 41A:
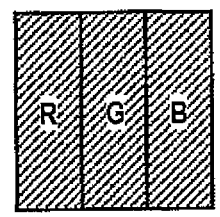
FIG. 41A is a diagram showing one pixel of a conventional display device which uses three primaries for displaying.
Figure 41B:
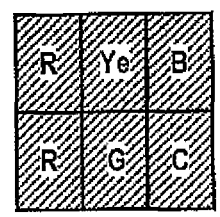
FIG. 41B is a diagram showing one pixel of a multi-primary display device.

For example, when a pixel of a three-primary display device, which is composed of three subpixels disposed in 1 row by 3 columns as shown in FIG. 41A, is replaced by a pixel of a multi-primary display device which is composed of six subpixels disposed in 2 rows by 3 columns as shown in FIG. 41B, the width of each subpixel along the column direction (up-down direction in the figure) becomes half. Depending on the arrangement of subpixels, this results in a problem in that, when a single-colored line extending along the row direction is displayed, the line width is halved. This will be described more specifically below.

Figure 42C:
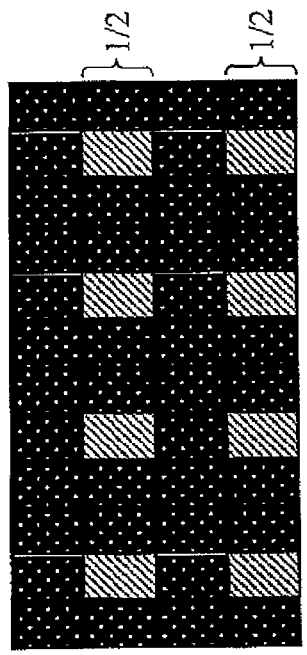
FIGS. 42A to 42C are diagrams for explaining reasons why a decrease in line width occurs in a multi-primary display device.
Figure 42B:
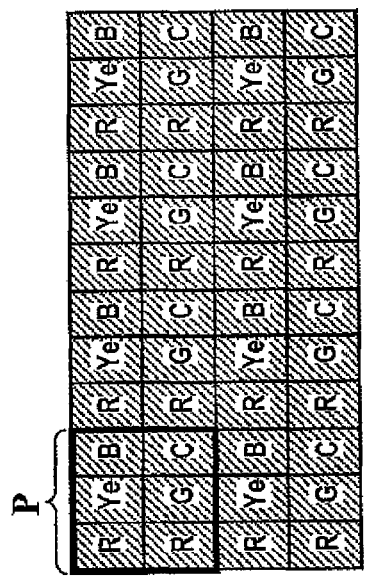
Figure 42A:
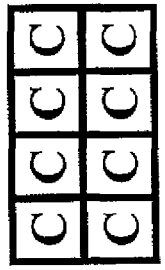

Assuming that the subpixels shown in FIG. 41B have an arrangement called pattern C, if the pixels P having this pattern C are simply placed in a matrix arrangement as shown in FIG. 42A, an arrangement shown FIG. 42B will be obtained. If a green line is displayed by setting the green subpixel G to the highest luminance and the other subpixels to the lowest luminance in this arrangement, as shown in FIG. 42C, the width of a green line extending along the row direction will be ½ of that shown in FIG. 38B (i.e., a width corresponding to a half of a subpixel of the three-primary display device).

In order to prevent such a decrease in line width, it is preferable that two pixels adjoining along the row direction differ in their arrangements of plural subpixels. For example, assuming that the subpixels shown in FIG. 43A have an arrangement called pattern D (which is a different arrangement pattern from pattern C shown in FIG. 41B), if the pixels P having pattern C and the pixels P' having pattern D are alternately disposed along the row direction as shown in FIG. 43B (i.e., the pixels P of pattern C are disposed in the odd-numbered columns and the pixels P' of pattern D are disposed in the even-numbered columns), an arrangement shown in FIG. 43C will be obtained.

Between the pixels P of pattern C and the pixels P' of pattern D, the arrangement of the green subpixel G, the blue subpixel B, the yellow subpixel Ye, and the cyan subpixel C within the pixel is different. Therefore, in the arrangement shown in FIG. 43C, between two pixels P, P' adjoining along the row direction, the green subpixel G, the blue subpixel B, the yellow subpixel Ye, and the cyan subpixel C belong to different rows. Specifically, the yellow subpixel Ye and the blue subpixel B belong to the first row in the pixel P, but belong to the second row in the pixel P'. Moreover, the green subpixel G and the cyan subpixel C belong to the second row in the pixel P, but belong to the first row in the pixel P'.

Figure 43D:
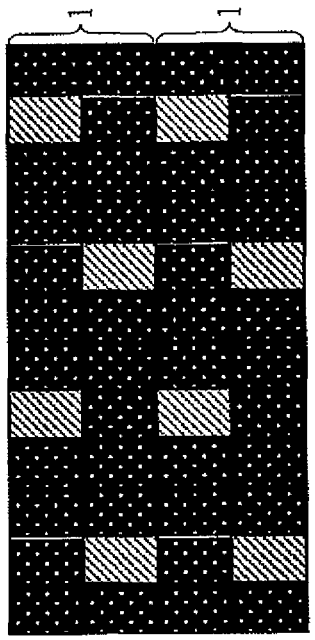
FIGS. 43A to 43D are diagrams for explaining reasons why a decrease in line width can be prevented by adopting a certain subpixel arrangement in a multi-primary display device.
Figure 43C:
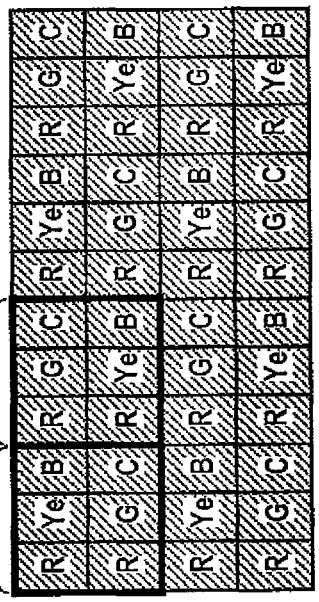
Figure 43A:
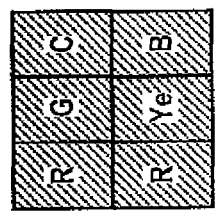
Figure 43B:
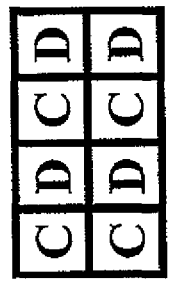

Therefore, if a green line is displayed by setting the green subpixel G to the highest luminance and the other subpixels to the lowest luminance in this arrangement, for example, as shown in FIG. 43D, the width of a green line extending along the row direction will be the same as that shown in FIG. 38B (i.e., the width of one subpixel of the three-primary display device).

In order to prevent a decrease in line width with a greater certainty, it is most preferable that subpixels of as many color as possible belong to different rows between two pixels adjoining along the row direction. However, sufficient effects will be obtained so long as at least one of the green subpixel G and the yellow subpixel Ye having a high lightness belongs to different rows, and even more sufficient effects will be obtained if both the green subpixel G and the yellow subpixel Ye belong to different rows.

Although the above description has been directed to constructions where each pixel is preferably defined by six subpixels, the present invention is not limited thereto. Also in constructions where each pixel is defined by more (seven or more) subpixels, or each pixel is defined by five subpixels (e.g., the cyan subpixel may be omitted), the effect of displaying bright red can be obtained so long as each pixel includes the first red subpixel R1 and second red subpixel R2. Moreover, by disposing the subpixels in the aforementioned manners (specifically, disposing the blue subpixel and the yellow subpixel so as to be contiguous, or ensuring that the subpixels have different arrangement patterns between two adjoining pixels), it becomes possible to attain uniform white display and prevent a decrease in line width.

In the constructions illustrated above, the plurality of subpixels defining each pixel are of substantially the same size. Alternatively, the plurality of subpixels defining each pixel may be of different size. However, using subpixels of different sizes may make the designing of the display device difficult, or complicate the production steps of the display device. Such problems will not occur in the case where the plurality of subpixels defining each pixel are of substantially same size.

Next, the more specific structure of the liquid crystal display device 100 according to the present preferred embodiment will be described.

Figure 44:
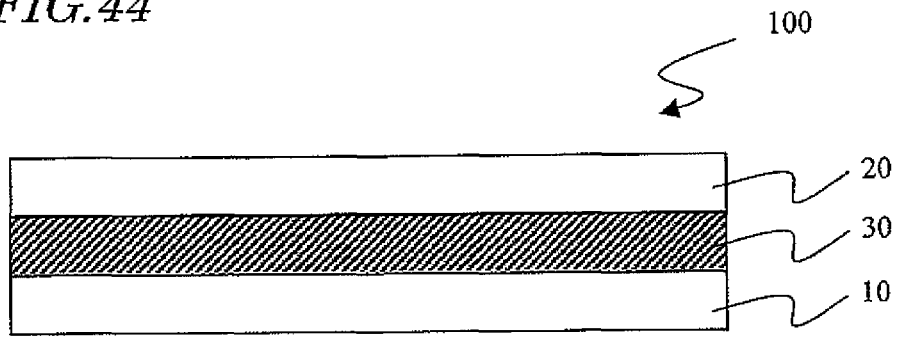
FIG. 44 is a cross-sectional view schematically showing the liquid crystal display device 100.

As shown in FIG. 44, the liquid crystal display device 100 includes an active matrix substrate 10, a color filter substrate 20, and a liquid crystal layer 30 interposed therebetween, for example.

Although not shown, a plurality of switching elements (e.g., TFTs) and pixel electrodes which are electrically connected to the respective switching elements are provided on the active matrix substrate 10.

Figure 45:
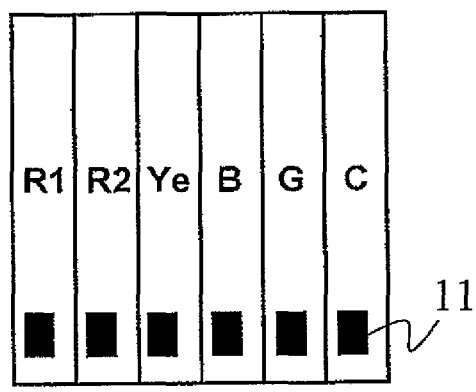
FIG. 45 is a diagram showing an example of switching element arrangement.
Figure 46:
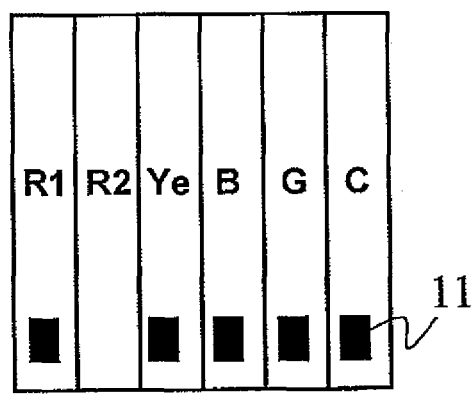
FIG. 46 is a diagram showing another example of switching element arrangement.

Typically, as shown in FIG. 45, a switching element 11 is provided corresponding to each subpixel, so that each subpixel is driven independently. However, in the case where the first red subpixel R1 and the second red subpixel R2 are contiguously arranged within the pixel, as shown in FIG. 46, the switching element 11 corresponding to one of the first red subpixel R1 and the second red subpixel R2 may be omitted, so that the first red subpixel R1 and second red subpixel R2 are driven with the one same switching element 11.

When using a construction where the first red subpixel R1 and second red subpixel R2 are driven independently of each other, it is possible to reduce the viewing angle dependence of γ characteristics (i.e., disagreement between the γ characteristics when observing a display surface in the frontal direction and the γ characteristics when observing the display surface in an oblique direction).

As a technique for reducing the viewing angle dependence of γ characteristics, a technique called multipixel driving is proposed in Japanese Laid-Open Patent Publication Nos. 2004-62146 and 2004-78157. In this technique, one subpixel is divided into two regions, and different voltages are applied to these regions, whereby the viewing angle dependence of γ characteristics is reduced.

When using a construction where the first red subpixel R1 and second red subpixel R2 are driven independently of each other, it is naturally possible to apply different voltages across the liquid crystal layer over the first red subpixel R1 and the liquid crystal layer over the second red subpixel R2. Therefore, an effect of reducing the viewing angle dependence of γ characteristics is obtained, similarly to the multipixel driving disclosed in Japanese Laid-Open Patent Publication Nos. 2004-62146 and 2004-78157, supra.

Figure 47:
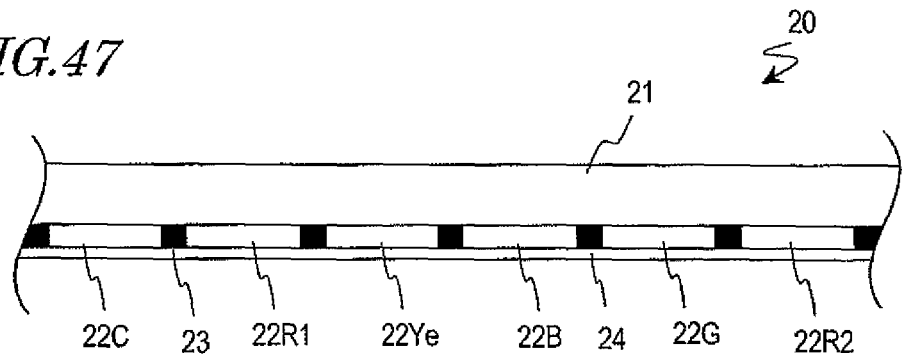
FIG. 47 is a cross-sectional view schematically showing a color filter substrate of the liquid crystal display device 100.

FIG. 47 shows an example of a specific structure of the color filter substrate 20. The color filter substrate 20 includes a transparent substrate (e.g., a glass substrate or a plastic substrate) 21 and a plurality of color filters provided in regions of the substrate 21 respectively corresponding to the pixels.

Specifically, the plurality of color filters are: first and second red color filters 22R1 and 22R2 which allow red light to be transmitted therethrough; a green color filter 22G which allows green light to be transmitted therethrough; a blue color filter 22B which allows blue light to be transmitted therethrough; a yellow color filter 22Ye which allows yellow light to be transmitted therethrough; and a cyan color filter 22C which allows cyan light to be transmitted therethrough.

A black matrix 23 is provided in between color filters. Moreover, a counter electrode 24 is provided on the color filters and the black matrix 23.

The color filters can be formed by a known technique, e.g., ink jet technique.

As has already been described, the liquid crystal display device 100 performs multi-primary display. Therefore, the liquid crystal display devices 100 and 200 include a multi-primary controller which receives externally-input image signals and generates various control signals for multi-primary displaying. An example of a multi-primary controller is shown in FIG. 48.

Figure 48:
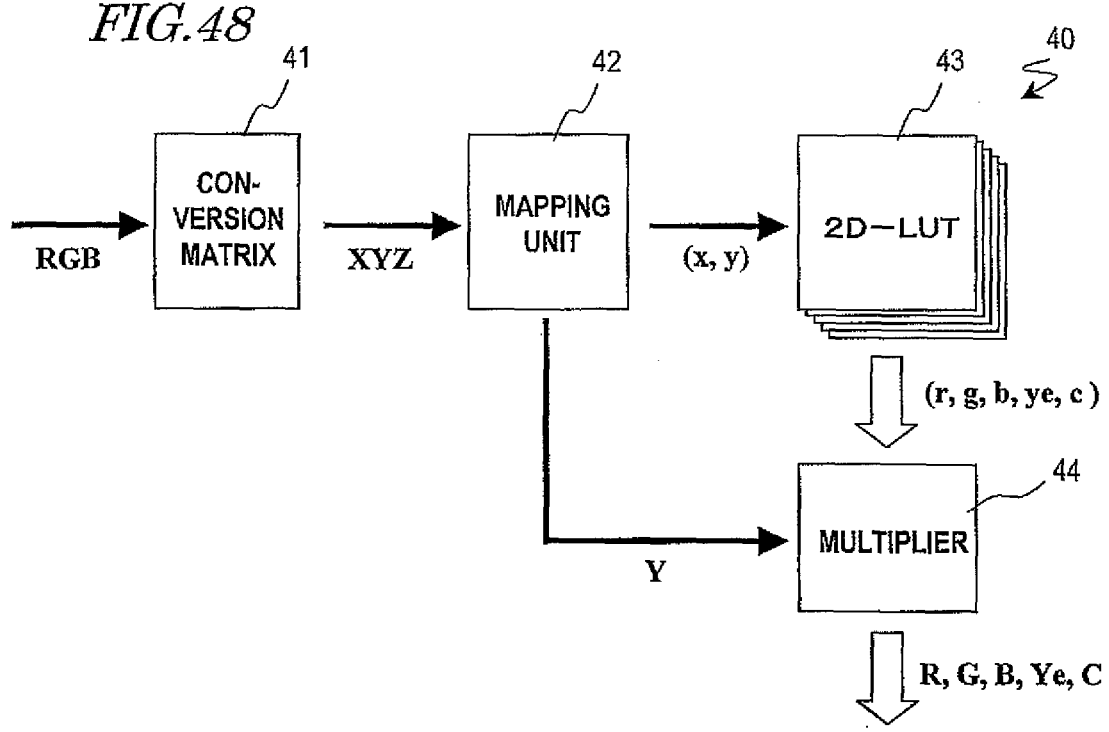
FIG. 48 is a block diagram schematically showing a multi-primary controller in the liquid crystal display device 100.
Figure 49:
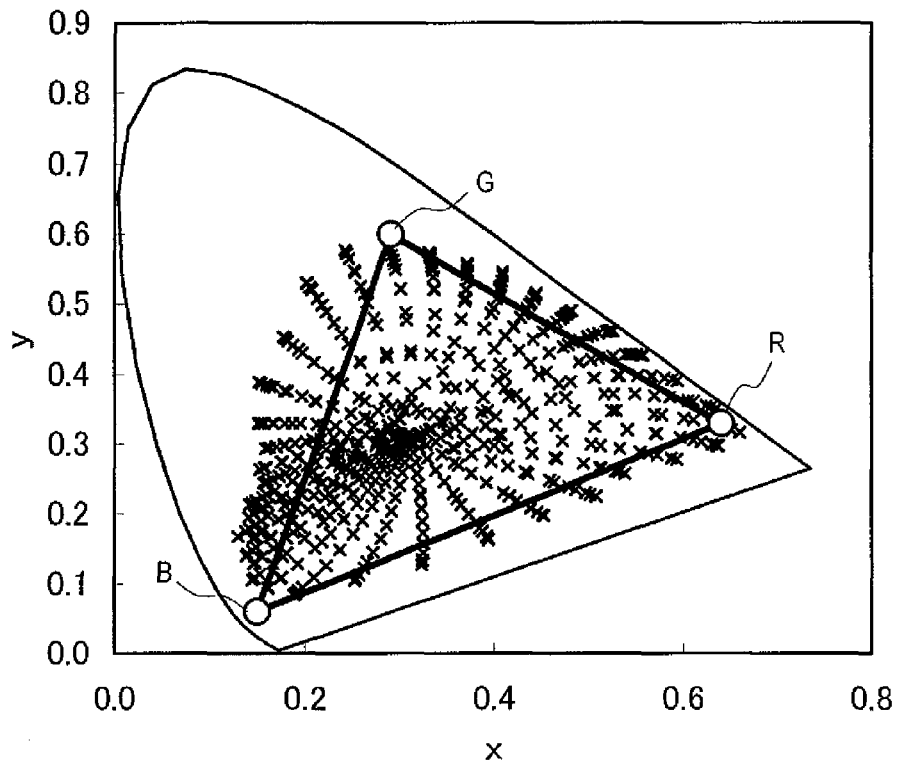
FIG. 49 is a diagram showing a color gamut of a conventional liquid crystal display device which uses three primaries for displaying.

The multi-primary controller 40 shown in FIG. 48 includes a conversion matrix 41, a mapping unit 42, a plurality of two-dimensional look-up tables 43, and a multiplier 44.

Externally-input RGB signals are converted by the conversion matrix 41 into signals (XYZ signals) which correspond to the color space of the XYZ color system. The XYZ signals are mapped by the mapping unit 42 onto the xy coordinate space, whereby signals corresponding to the Y value and chromaticity coordinates (x, y) are generated. There are as many two-dimensional look-up tables 43 as there are primary colors. Based on these two-dimensional look-up tables 43, data (r, g, b, ye, c) corresponding to the hue and chroma of the color to be displayed in each subpixel is generated from the chromaticity coordinates (x, Such data and the Y value are multiplied in the multiplier 44, whereby signals R, G, B, Ye, and C corresponding to the respective primary colors are generated. Note that the technique for generating signals for multi-primary displaying is not to be limited to the technique described herein, which is only exemplary.

According to a preferred embodiment of the present invention, there is provided a display device which has a wide color gamut and is able to display bright red. Also according to a preferred embodiment of the present invention, there is provided a color filter substrate to be used in such a display device.

The present invention is suitably used for various display devices, e.g., liquid crystal display devices, CRTs (cathode-ray tubes), organic EL display devices, plasma display panels, and SEDs (Surface-conduction Electron-emitter Displays).

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A display device comprising:
a plurality of pixels each defined by a plurality of subpixels; wherein
each and every one of the plurality of pixels respectively include first and second red subpixels to display red, a green subpixel to display green, a blue subpixel to display blue, and only one yellow subpixel to display yellow; and
the blue subpixel and the only one yellow subpixel in each and every one of the plurality of pixels are contiguously arranged; wherein
the blue subpixel, the only one yellow subpixel, and the first or second red subpixel are contiguously arranged in this order in a straight-line direction.

2. The display device of claim 1, wherein the green subpixel, the blue subpixel, the only one yellow subpixel, and the first or second red subpixel are contiguously arranged in this order in the straight-line direction.

3. The display device of claim 1, wherein, in each of the plurality of pixels, at least one of the blue subpixel and the only one yellow subpixel is interposed between other subpixels.

4. The display device of claim 1, wherein, in each of the plurality of pixels, the blue subpixel and the only one yellow subpixel are disposed contiguous, and the blue subpixel and the only one yellow subpixel being disposed contiguous are interposed between other subpixels.

5. The display device of claim 4, wherein the blue subpixel and the only one yellow subpixel that are contiguously arranged are located near a center of the pixel.

6. The display device of claim 1, wherein the display device is a liquid crystal display device comprising a liquid crystal layer.

7. A display device comprising:
a plurality of pixels each defined by a plurality of subpixels; wherein
each and every one of the plurality of pixels respectively include first and second red subpixels to display red, a green subpixel to display green, a blue subpixel to display blue, and a yellow subpixel to display yellow;
the blue subpixel and the yellow subpixel in each and every one of the plurality of pixels are contiguously arranged; and
the plurality of subpixels further include a cyan subpixel to display cyan, and one of the first and second red subpixels, the green subpixel, the blue subpixel, the yellow subpixel, the other of the first and second red subpixels, and the cyan subpixel are contiguously arranged in this order.

8. A display device comprising:
a plurality of pixels each defined by a plurality of subpixels; wherein
each and every one of the plurality of pixels respectively include first and second red subpixels to display red, a green subpixel to display green, a blue subpixel to display blue, and a yellow subpixel to display yellow;
the blue subpixel and the yellow subpixel in each and every one of the plurality of pixels are contiguously arranged; and
the plurality of subpixels further include a cyan subpixel to display cyan, and the cyan subpixel, the green subpixel, the blue subpixel, the yellow subpixel, one of the first and second red subpixels, and the other of the first and second red subpixels are contiguously arranged in this order.

9. A display device comprising:
a plurality of pixels each defined by a plurality of subpixels; wherein
each and every one of the plurality of pixels respectively include first and second red subpixels to display red, a green subpixel to display green, a blue subpixel to display blue, and a yellow subpixel to display yellow;
the blue subpixel and the yellow subpixel in each and every one of the plurality of pixels are contiguously arranged; and
the plurality of subpixels further include a cyan subpixel to display cyan, and the cyan subpixel, the blue subpixel, the yellow subpixel, and the first or second red subpixel are contiguously arranged in this order.

10. The display device of claim 9, wherein one of the first and second red subpixels, the cyan subpixel, the blue subpixel, the yellow subpixel, the other of the first and second red subpixels, and the green subpixel are contiguously arranged in this order.

11. The display device of claim 9, wherein the green subpixel, the cyan subpixel, the blue subpixel, the yellow subpixel, one of the first and second red subpixels, and the other of the first and second red subpixels are contiguously arranged in this order.

12. A display device comprising:
a plurality of pixels each defined by a plurality of subpixels; wherein
each and every one of the plurality of pixels respectively include first and second red subpixels to display red, a green subpixel to display green, a blue subpixel to display blue, and a yellow subpixel to display yellow;
the blue subpixel and the yellow subpixel in each and every one of the plurality of pixels are contiguously arranged; and
the green subpixel, one of the first and second red subpixels, the blue subpixel, the yellow subpixel, and the other of the first and second red subpixels are contiguously arranged in this order in a straight-line direction.

13. The display device of claim 12, wherein the plurality of subpixels further include a cyan subpixel to display cyan, and in each of the plurality of pixels, one of the first and second red subpixels, the cyan subpixel, the green subpixel, the other of the first and second red subpixels, the blue subpixel, and the yellow subpixel are contiguously arranged in this order in the straight-line direction.

14. A display device comprising:
a plurality of pixels each defined by a plurality of subpixels disposed in one row by multiple columns, the plurality of subpixels in each of the plurality of pixels including only the same color subpixels; wherein
the plurality of subpixels include first and second red subpixels to display red, a green subpixel to display green, a blue subpixel to display blue, and only one yellow subpixel to display yellow; and
between two pixels adjoining along a column direction, an arrangement between all of the plurality of subpixels in one of the two pixels adjoining along the column direction is different from an arrangements of all of the plurality of subpixels in another one of the two pixels adjoining along the column direction.

15. The display device of claim 14, wherein, between two pixels adjoining along the column direction, at least one of the green subpixel and the only one yellow subpixel belongs to different columns.

16. The display device of claim 15, wherein, between two pixels adjoining along the column direction, both of the green subpixel and the only one yellow subpixel belong to different columns.

17. A display device comprising:
a plurality of pixels each defined by a plurality of subpixels disposed in multiple rows by multiple columns, the plurality of subpixels in each of the plurality of pixels including only the same color subpixels; wherein
each and every one of the plurality of pixels respectively include first and second red subpixels to display red, a green subpixel to display green, a blue subpixel to display blue, and only one yellow subpixel to display yellow; and
between two pixels adjoining along a row direction, an arrangement between all of the plurality of subpixels in one of the two pixels adjoining along the row direction is different from an arrangements of all of the plurality of subpixels in another one of the two pixels adjoining along the row direction.

18. The display device of claim 17, wherein between two pixels adjoining along the row direction, at least one of the green subpixel and the only one yellow subpixel belongs to different rows.

19. The display device of claim 18, wherein, between two pixels adjoining along the row direction, both of the green subpixel and the only one yellow subpixel belong to different rows.

* * * * *